(12) United States Patent
Takenaka

(10) Patent No.: US 8,456,603 B2
(45) Date of Patent: Jun. 4, 2013

(54) DISPLAY DEVICE AND FLAT DISPLAY DEVICE

(75) Inventor: Yuuichi Takenaka, Chiba (JP)

(73) Assignees: Hitachi Displays, Ltd., Chiba-ken (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 1293 days.

(21) Appl. No.: 11/984,255

(22) Filed: Nov. 15, 2007

(65) Prior Publication Data

US 2008/0117376 A1 May 22, 2008

(30) Foreign Application Priority Data

Nov. 22, 2006 (JP) .................................. 2006-315389

(51) Int. Cl.
  *G02F 1/1345* (2006.01)
(52) U.S. Cl.
  USPC ............ 349/152; 349/149; 349/150; 349/151
(58) Field of Classification Search
  USPC .................................................. 349/149–152
  See application file for complete search history.

(56) References Cited

U.S. PATENT DOCUMENTS

| 5,982,470 A * | 11/1999 | Nakahara et al. ............. 349/153 |
| 6,172,732 B1* | 1/2001 | Hayakawa et al. ........... 349/152 |
| 7,164,460 B2 | 1/2007 | Hagiwara |
| 2001/0033355 A1* | 10/2001 | Hagiwara ...................... 349/152 |
| 2003/0189686 A1* | 10/2003 | Hirosue et al. ................ 349/149 |
| 2004/0263761 A1* | 12/2004 | Tannas, Jr. .................... 349/153 |
| 2006/0007086 A1* | 1/2006 | Rhee et al. ..................... 345/87 |

FOREIGN PATENT DOCUMENTS

| CN | 1725077 | 1/2006 |
| JP | 09-260579 | 3/1996 |
| TW | 487896 | 5/2002 |
| TW | 200305136 | 10/2003 |

* cited by examiner

*Primary Examiner* — Jessica M Merlin
(74) *Attorney, Agent, or Firm* — Stites & Harbison PLLC; Juan Carlos A. Marquez, Esq.; Nicholas B. Trenkle, Esq.

(57) ABSTRACT

The present invention prevents, when a COF which is connected with an external circuit is bent in a flat display device, the disconnection of lines on the COF. At a position where a line of the COF is connected to terminal portions of a TFT, and the line having a large width is branched into lines having a small width T1 to T3 or T4 to T6. By displacing line branching positions from each other as indicated by an arrow A and an arrow B, when the COF is bent or deformed, stress applied to the line branching positions can be dispersed thus preventing the disconnection of lines.

15 Claims, 19 Drawing Sheets

DISPLAY DEVICE AND FLAT DISPLAY DEVICE

The present application claims priority from Japanese application JP2006-315389 filed on Nov. 22, 2006, the content of which is hereby incorporated by reference into this application.

BACKGROUND OF THE INVENTION

1. Field of the Invention

The present invention relates to a display device, and more particularly to the connection structure of a terminal portion and the constitution of a flexible wiring film for establishing an electrical connection of a flat display device with an external circuit.

2. Description of the Related Art

The application of a liquid crystal display device has been spreading from computer monitors, mobile phones and the like to television receiver sets. To drive a liquid crystal display panel, it is necessary to supply a power source, signals and the like to the liquid crystal display panel from the outside. The power source, the signals and the like are often supplied by way of a chip-on-film (COF) which is connected to a terminal portion of the liquid crystal display panel. The COF is a film which forms terminals for connection with terminals of the liquid crystal display panel on one side thereof, forms terminals for connection with a printed circuit board or the like on another side thereof which faces the above-mentioned one side thereof in an opposed manner, and mounts an IC chip which incorporates a liquid crystal drive circuit and the like therein on an upper surface thereof. A technique which uses a tape carrier package (TCP) in place of the COF has been also has the same technical background.

The terminals of the COF for connecting the COF with the liquid crystal display panel or the like is large in number and, at the same time, various kinds of COFs have been known. For example, with respect to lines formed on the COF, lines for supplying the power source to the liquid crystal display panel are formed with a width larger than a width of other lines. Corresponding to such widening of the power-source supply lines, the terminals for supplying the power source to the liquid crystal display panel are formed with a size larger than other terminal portions to allow a large current to flow therethrough. On the other hand, the COF and the terminals of the liquid crystal display panel are connected with each other using an anisotropic conductive film. That is, the liquid crystal display panel and the COF are connected with each other by sandwiching the anisotropic conductive film between the terminals of the liquid crystal display panel and the COF and by bonding the terminals of the liquid crystal display panel and the COF by thermocompression bonding.

The thermocompression bonding is performed by pushing a thermal head to the COF from above. In performing such a connection method, when the COF terminals differ in size, width, pitch and the like, a temperature, a pressure or the like applied to the connection portion becomes partially non-uniform thus often damaging the reliability of the terminal portions. To cope with such a drawback, for example, even when the sizes of the terminal portions of the liquid crystal display panel differ from each other, a pitch of the terminal portions of the COF is set smaller than a width of the terminal of the liquid crystal display panel and is set to a uniform value. The anisotropic conductive film becomes conductive in the direction that the liquid crystal display panel and the COF face each other in an opposed manner and becomes non-conductive in the direction perpendicular to such an opposedly facing direction. There has been known a technique which enhances the reliability of the terminal portions by adopting such a constitution.

Further, it is not always the case that all sides of the COF or the liquid crystal display panel have the terminal portions and there are some sides which do not have terminal portions. When some sides do not have the terminal portions, a condition for performing the thermocompression bonding using the thermal head differs and hence, the connection of the terminal portions becomes non-uniform. To prevent such non-uniform connection of the terminal portions, patent document 1 (JP-A-9-260579) describes a technique in which even when a liquid crystal display panel or an IC chip mounted on a COF has a side which does not have terminal portions, a dummy terminal is formed on COF corresponding to a position without a terminal so as to make a connection condition of the terminal portions uniform thus enhancing the reliability of the terminal portions.

SUMMARY OF THE INVENTION

With the use of the above-mentioned related art, the non-uniform connection condition of the terminal portions which arises when the terminal portions of the liquid crystal display panel and the COF are connected with each other by way of the anisotropic conductive film can be eliminated thus enhancing the reliability of the connecting portion. On the other hand, in the inside of the COF, it is necessary to put together a plurality of lines to which a large terminal is connected into one line. This is because a size of the terminal is large at a side where the COF and a printed circuit board or the like are connected with each other and hence, it is possible to enhance the reliability of the connection between the COF and a printed circuit board and the like by putting together the neighboring lines which supply the same voltage in the inside of the COF. Copper lines are used as the lines of the COF to reduce an electric resistance. Here, the printed circuit board is constituted by forming lines on a glass epoxy substrate.

When two lines are put together in the inside of the COF, for example, a width of the lines after putting them together is larger than a total width of two lines before putting them together. This is because that although the insulation is held by defining a space between two lines before putting them together, the insulation is unnecessary after connecting two lines with each other and hence, it is advantageous to form the lines with the width as large as possible to reduce the electric resistance.

As described above, when two fine lines are put together to form one bold line, with respect to the widths of the copper lines, the width of one bold line is larger than a sum of the widths of two fine lines and hence, one bold line portion exhibits a larger mechanical strength against bending of the copper line or the like than two line portions. Further, at a portion where two lines are put together to form one line, this mechanical strength is sharply changed. Here, although the expression that the fine lines are put together is used, in other words, this expression has the same meaning as the expression that the bold line is branched and hence, the expression that the bold line is branched is also used.

With respect to the COF, to satisfy a demand for the miniaturization of a profile of the liquid crystal display device, there may be a case that the COF is used in a state that the COF is bent downwardly below the liquid crystal display panel. Further, due to driving of the liquid crystal display panel or a change of an ambient temperature, the COF is repeatedly exposed to the deformation attributed to the difference in thermal expansion between a TFT substrate and a printed circuit board. When portions where the line is branched are present in parallel in the COF, there may be a case that stress is concentrated on such portions leading to the disconnection of the copper line. There may be a case that the bold line is branched into three or more fine lines. Also in such a case, there exists a possibility that fine lines are disconnected at branched portions due to the concentration of stress in the same manner.

The present invention has been made to overcome the above-mentioned drawbacks of the related art and specific means to overcome such drawbacks are as follows.

(1) In a flat display device which mounts pixels on a substrate thereof in a matrix array, a plurality of terminals for connection with an external circuit is formed on an end portion of the substrate, a wiring film which is formed by mounting a plurality of lines on an insulation film is connected to the plurality of terminals, and the wiring film includes a side portion which is connected with the plurality of terminals, a plurality of lines to be connected with the plurality of terminals is formed on the wiring film, and each of the plurality of lines is, on a side portion at which the lines are connected with the plurality of terminals, branched into a plurality of lines, and distances of positions at which the plurality of lines is branched from the side portion differ from each other depending on the lines.

(2) In the flat display device having the constitution (1), the branched lines of the wiring film are connected to each of the plurality of terminals.

(3) In the flat display device having the constitution (1), each of the plurality of lines includes three or more branching positions, and the branching positions within the same line differ from each other with respect to the distances from the side portion.

(4) In the flat display device having the constitution (1), a dummy line which is not connected to the terminal of the substrate is formed between the plurality of lines.

(5) In the flat display device having the constitution (1), the wiring film is bent along a side portion of the flat display device.

(6) In the flat display device having the constitution (1), an IC chip is mounted on the wiring film.

(7) In the flat display device having the constitution (1), the flat display device is a liquid crystal display device.

(8) In the flat display device having the constitution (1), the flat display device is an organic EL display device.

(9) In the flat display device having the constitution (1), the flat display device is a field emission display.

(10) In a flat display device which mounts pixels on a substrate thereof in a matrix array, a plurality of terminals for connection with an external circuit is formed on an end portion of the substrate, a wiring film which is formed by mounting a plurality of lines on an insulation film is connected to the plurality of terminals, and the wiring film includes a side portion which is connected with the plurality of terminals, a plurality of lines to be connected with the plurality of terminals is formed on the wiring film, and each of the plurality of lines is, on a side portion at which the lines are connected with the plurality of terminals, branched into a plurality of lines having narrower widths, and distances of positions at which the plurality of lines is branched from the side portion differ from each other depending on branching positions, and the distances are changed in order from the outermost branching position of the wiring film.

(11) In the flat display device having the constitution (10), each of the plurality of lines includes three or more branching positions, and the neighboring branching positions in the same line are set such that the distances from the side portion are changed in order from the outermost branching position on the same line.

(12) In the flat display device having the constitution (10), a dummy line which is not connected to the terminal of the substrate is formed between the plurality of lines, and the dummy line is not branched.

(13) In the flat display device having the constitution (10), the wiring film is bent along a side portion of the flat display device.

(14) In a flat display device which mounts pixels on a substrate thereof in a matrix array, a plurality of terminals for connection with an external circuit is formed on an end portion of the substrate, a wiring film which is formed by mounting a plurality of lines on an insulation film is connected to the plurality of terminals, and the wiring film includes a side portion which is connected with the plurality of terminals, a plurality of lines to be connected with the plurality of terminals is formed on the wiring film, each of the plurality of lines is branched is, on a side portion at which the lines are connected with the plurality of terminals, branched into a plurality of lines having narrower widths, and the plurality of lines extend in parallel to a side portion of the wiring film, and in portions of the plurality of lines close to the side portion of the wiring film, distances of branching positions of the lines from the side portion are changed in order from the side portion of the wiring film.

(15) A flat display device having the constitution (14), wherein the plurality of lines includes an outermost peripheral line in the wiring film.

(16) In a flat display device which mounts pixels on a substrate thereof in a matrix array, a plurality of terminals for connection with an external circuit is formed on an end portion of the substrate, a wiring film which is formed by mounting a plurality of lines on an insulation film is connected to the plurality of terminals, and the wiring film includes a side portion which is connected with the plurality of terminals, a plurality of lines to be connected with the plurality of terminals is formed on the wiring film, each of the plurality of lines is branched is, on a side portion at which the lines are connected with the plurality of terminals, branched into a plurality of lines having narrower widths, the plurality of lines are arranged in a bending manner in the vicinity of branching portions, and widths of the plurality of lines are gradually narrowed toward the bent portions of the lines.

By adopting the above-mentioned constitution, the present invention can enhance the reliability of the connection between the display panel and the external circuit. To explain advantageous effects obtained by the above-mentioned respective constitutions, they are as follows.

According to the constitution (1), even when the wiring film is bent, it is possible to prevent the concentration of bending stress on the branching portions of the lines and hence, it is possible to prevent the disconnection of the lines of the wiring film thus enhancing the reliability of a flat display device.

According to the constitution (2), when the terminal portion formed on the substrate of the display device is large, the plurality of lines of the wiring film can be connected and hence, the thermosetting condition in the connection process becomes uniform whereby the reliability of the connection portion can be enhanced. Further, even when such a constitution is adopted, due to the present invention, it is possible to prevent the disconnection or the like attributed to the bending stress applied to the wiring film.

According to the constitution (3), even when the line having the large width formed on the wiring film is branched into three or more lines having the narrow width, the branching positions can be changed and hence, the concentration of stress when the wiring film is bent can be further prevented.

According to the constitution (4), by arranging the dummy line between the lines which are formed on the wiring film and are connected with the substrate, the reliability of the connection portion can be increased and, at the same time, the dummy line performs a function of alleviating the concentration of bending stress.

According to the constitution (5), the wiring film is bent along the side portion of the display device and hence, the display device can be formed in a compact shape. At the same time, due to the above-mentioned constitution, even when bending stress is continuously applied to the wiring film, the concentration of the bending stress applied to the branching portions can be alleviated thus preventing the disconnection of the lines.

According to the constitution (6), even when the terminal pitch of the IC chip and the terminal pitch of the wiring film end portions differ from each other, by adopting the constitution of the present invention, the reliability of the terminal connection can be ensured and, at the same time, the disconnection of the wiring film can be prevented.

According to the constitution (7), it is possible to increase the reliability of the connection means using the wiring film which connects the liquid crystal display device and the external circuit.

According to the constitution (8), it is possible to increase the reliability of the connection means using the wiring film which connects the organic EL display device and the external circuit.

According to the constitution (9), it is possible to increase the reliability of the connection means using the wiring film which connects the field emission display and the external circuit.

According to the constitution (10), positions at which the lines of the wiring film are branched are continuously changed and hence, the concentration of stress when the wiring film is bent can be further reduced.

According to the constitution (11), even when the line having the large width of the wiring film is branched into three or more lines, the branching positions can be changed and hence, the concentration of stress when the wiring film is bent can be further alleviated.

According to the constitution (12), the dummy line is formed between the respective lines formed on the wiring film and the dummy line is not branched and hence, the concentration of bending stress when the wiring film is bent can be alleviated.

According to the constitution (13), the wiring film is bent along the side portion of the display device and hence, the display device can be formed in a compact shape. At the same time, due to the above-mentioned constitution, even when bending stress is continuously applied to the wiring film for a long time, the concentration of the bending stress applied to the branching portions can be alleviated thus preventing the disconnection of the lines.

According to the constitution (14) and the constitution (15), it is possible to prevent the concentration of stress on the branched fine lines when the wiring film is bent.

According to the constitution (16), when the lines formed on the wiring film are arranged in a bent shape, widths of the lines are gradually changed in the vicinity of bending points and hence, when the wiring film is bent, it is possible to reduce a possibility that stress is concentrated in the vicinity of the bending points and the lines are disconnected.

DESCRIPTION OF THE PREFERRED EMBODIMENTS

Although following embodiments are described in conjunction with a liquid crystal display device, the present invention is also applicable to an organic EL display device, an FED (field emission display) or the like in the same manner.

Embodiment 1

Figure 1:
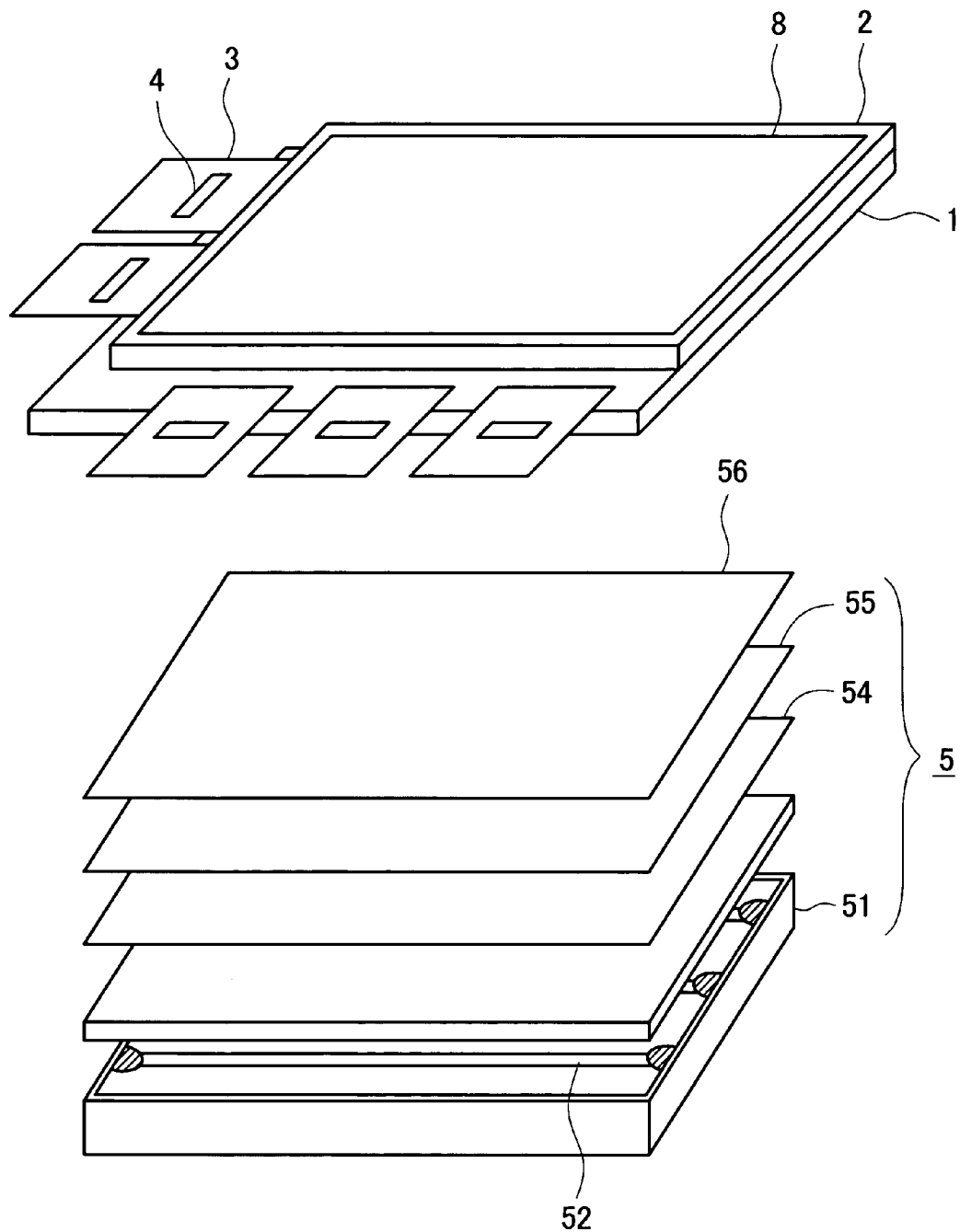
FIG. 1 is a perspective view of a liquid crystal display device to which the present invention is applied.

FIG. 1 shows a TV-use liquid crystal display module as an example to which the present invention is applied. In FIG. 1, a TFT substrate 1 on which pixel electrodes, thin film transistors and the like are arranged in a matrix array and a color filer substrate 2 on which color filters are formed in a matrix array are arranged to overlap each other. Since COFs 3 and the like are mounted on the TFT substrate 1, the TFT substrate 1 is larger than the color filter substrate 2. Here, although COF is an abbreviation of a chip-on-film, in this specification, COF may be also used to imply a COF film. Liquid crystal is sandwiched between the TFT substrate 1 and the color filter substrate 2. An upper polarizer 8 is adhered to an upper surface of the color filter substrate 2, and a lower polarizer (not shown in the drawing) is adhered to a lower surface of the TFT substrate 1. The COF on which an IC chip 4 having a drive circuit is mounted is mounted on two sides of the TFT substrate 1. In FIG. 1, three COFs are mounted on the long side of the TFT substrate 1 and two COFs are mounted on the short side. However, FIG. 1 is drawn in a simplified manner, and the number of COFs mounted on the TFT substrate 1 is changed corresponding to a ratio between the number of signal lines of the TFT substrate 1 and the number of signal lines of the COFs.

A backlight 5 is mounted on a back surface of the liquid crystal display panel. Fluorescent lamps 52 are used as a light source in the backlight 5 shown in FIG. 1. The fluorescent lamps 52 are arranged in the inside of a lower frame, and a reflector is formed in the inside of the lower frame 51. A diffusion plate 53 is formed on the fluorescent lamps 52 to make light emitted from the fluorescent lamps 52 uniform. Three diffusion sheets consisting of a diffusion sheet A 54, a diffusion sheet B 55 and a diffusion sheet C 56 are formed on the diffusion plate 53. The reason three diffusion sheets are used is that the larger the number of the diffusion sheets, the more uniform the light can be made and, at the same time, the respective diffusion sheets have properties to direct the light from the back surface in the direction toward the liquid crystal display panel and hence, the utilization efficiency of light from the backlight 5 can be enhanced.

The light from the backlight 5 is converted into linear polarized light by the lower polarizer mounted on the lower surface of the TFT substrate 1. The linearly-polarized light is modulated by the liquid crystal and is polarized by the upper polarizer 8 so as to form images. Here, the liquid crystal is operated in response to signals given to pixel electrodes and controls the light from the backlight 5.

Figure 2:
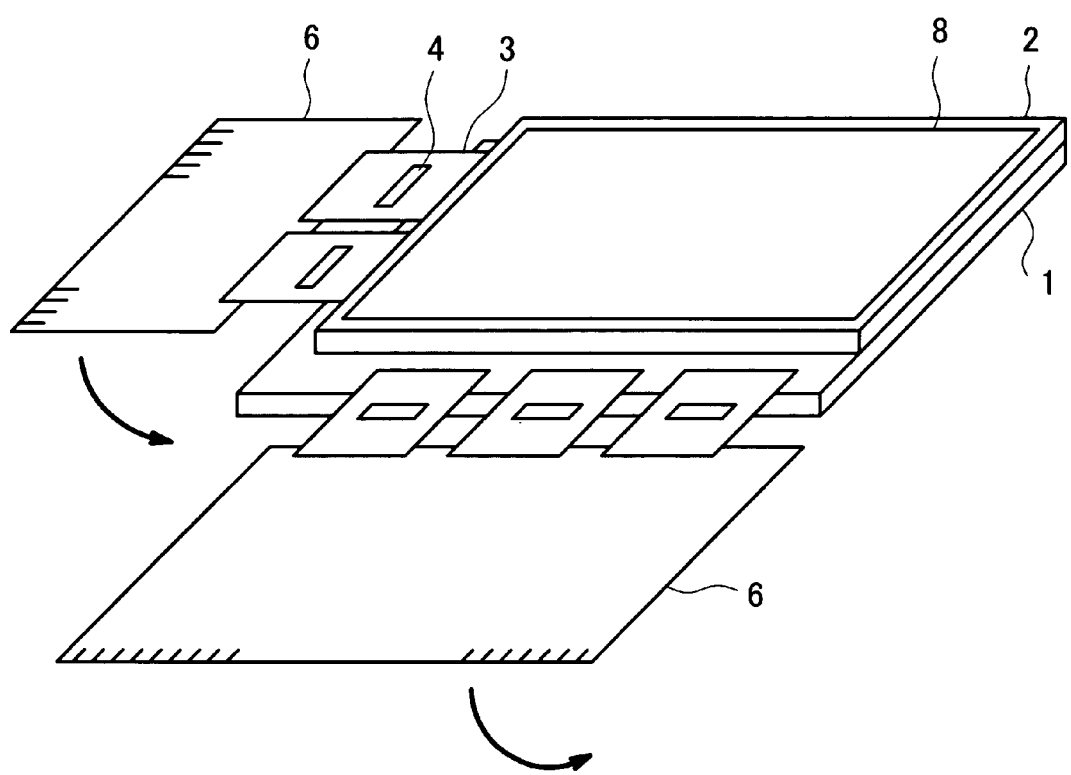
FIG. 2 is a perspective view of a liquid crystal display panel to which the present invention is applied.

The IC chips 4 for driving the liquid crystal are mounted on the COFs 3. The supply of a power source and the supply of signals to the IC chips 4 from a host computer are performed via printed circuit boards 6 shown in FIG. 2. In FIG. 2, the backlight 5 shown in FIG. 1 is omitted. After connecting the printed circuit boards 6 to the TFT substrate 1, the COFs 3 and the printed circuit boards 6 are bent and extend along a back surface of the backlight 5. Arrows shown in FIG. 2 indicate that the printed circuit boards 6 and the COFs 3 are bent.

Here, on the COF 3, not only the signal lines for the IC chip 4 and the power source lines for the IC chip 4 but also lines which directly supply a power source to the liquid crystal display panel without passing an IC are formed. The power source supply line for the IC chip 4 and the power source supply line for directly supplying the power source to the liquid crystal display panel have widths thereof set larger than widths of other signal lines or the like. With such setting of widths of the power source supply lines, the electric resistance can be decreased. Accordingly, the lines having various widths are present in a mixed form in the inside of the COF.

Figure 3:
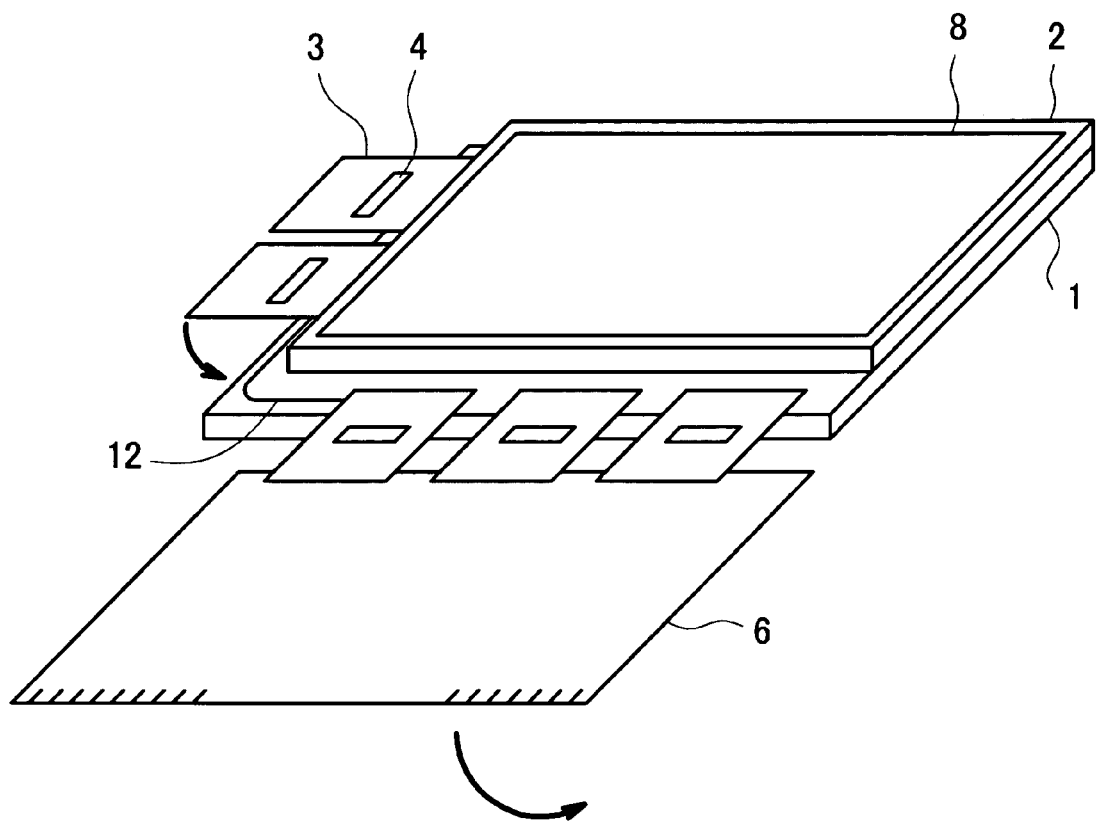
FIG. 3 is a perspective view of another liquid crystal display panel to which the present invention is applied.

FIG. 2 shows an example in which the printed circuit board 6 is connected to the COFs 3 on both sides, that is, on the short side and the long side of the TFT substrate 1. FIG. 3 shows an example in which the printed circuit board 6 is connected to only the COF 3 on the long side of the TFT substrate 1. The smaller the number of the printed circuit boards 6, the more advantageous the liquid crystal display device becomes correspondingly with respect to the reduction of cost, the enhancement of reliability of the connection and the like. A scanning circuit is formed on the short side of the TFT substrate 1. That is, the COFs 3 mounting the scanning-circuit-use IC chip 4 thereon are mounted on the short side of the TFT substrate 1.

Even when the printed circuit board 6 is not connected to the short side of the TFT substrate 1, the situation that it is necessary to supply the power source and the signals to be supplied to the IC chips and the like mounted on the short side from the outside is not changed. In the example shown in FIG. 3, the power source, the signals and the like for the scanning circuit are supplied from the outside using the printed circuit board 6 mounted on the long side of the TFT substrate 1, and the signals and the power source are supplied to the scanning circuit on the short side of the TFT substrate 1 using the COFs 3 mounted on the long side of the TFT substrate 1 and a bridge line 12 formed on the TFT substrate 1. Although only one bridge line 12 is shown in FIG. 3, the bridge line 12 is schematically shown in FIG. 3 and a plurality of bridge lines 12 are formed on the TFT substrate 1 in an actual operation. Here, the power source lines and the scanning signal lines which are connected to the short side of the TFT substrate 1 are required to exhibit low resistance values. Such setting of low resistance values is necessary for preventing lowering of a power source voltage and a distortion of a scanning signal. Accordingly, these lines are required to have large line widths also on the COFs mounted on the long side of the TFT substrate 1. Further, terminals which are mounted on the TFT substrate 1 corresponding to these lines are also required to be large-sized.

Figure 4:
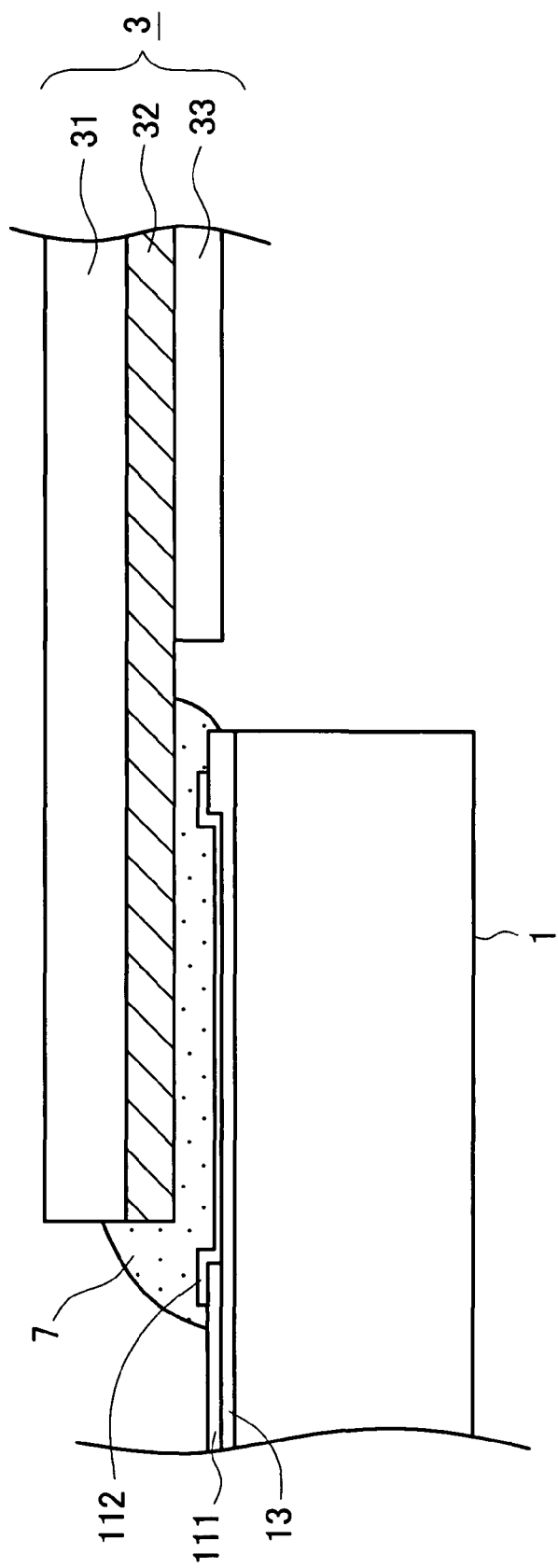
FIG. 4 is a cross-sectional view showing the connection between a terminal of a TFT substrate and a COF.

FIG. 4 is a schematic cross-sectional view showing a state in which the COF 3 is connected to a terminal portion of the TFT substrate 1. In FIG. 4, for example, a data signal line 13 extends from an effective screen on the TFT substrate 1. Since the data signal line 13 is formed of Al or the like and corrodes when exposed to the atmosphere, an upper surface of the date signal line 13 is covered with a passivation film 111 made of SiN or the like. A through hole is formed only in a portion of the passivation film 111 where the terminal portion is formed so as to expose Al which forms the data signal line 13. The exposed Al is covered with a chemically stable ITO film 112 so as to form the terminal portion of the TFT substrate 1.

On the other hand, the COF 3 is constituted of a base film 31, a copper line 32 and a protective film 33. A thickness of the base film 31 is set to 40 μm, for example, a thickness of the copper line 32 is set to 8 μm, for example, and a thickness of the protective film 33 is set to 10 μm, for example. An anisotropic conductive film 7 is interposed between the COF 3 and the terminal portion of the TFT substrate 1 so as to electrically connect a terminal of the TFT substrate 1 and the COF 3. The anisotropic conductive film 7 is formed by dispersing conductive particles in a sheet formed of a thermo setting adhesive agent having a thickness of 10 μm to 25 μm. When the anisotropic conductive film 7 is pressed in the thickness direction of the film by thermocompression bonding, a thermosetting resin is softened and fluidized and, at the same time, the conductive particles in the inside of the film are trapped between the terminal of the TFT substrate 1 and the COF 3, and this state is held by the compressed and cured adhesive agent so as to establish the connection between the terminal of the TFT substrate 1 and the COF 3.

This process is performed by pushing a thermal head for thermocompression bonding to the base film 31 of the COF 3 from above and by cooling the COF 3 thereafter. When widths, sizes, pitches or the like of lines of the COF 3 corresponding to the terminal portions of the TFT substrate 1 differ from each other, at the time of connecting the COF and the terminal portions of the TFT substrate 1 by way of the anisotropic conductive film 7, heating, cooling and pressurizing conditions on the thermal head differ from each other among the respective terminal portions and hence, the connection condition differs for every terminal portion thus giving rise to irregularities with respect to the reliability of the connection. To prevent such a drawback, at a portion of the COF 3 which is connected with the terminal portion of the TFT substrate 1, the copper lines 32 having a small width are arranged in parallel at a fixed pitch. Due to such a constitution, irrelevant to the sizes of the TFT terminal portions, the heating condition and the cooling and pressurizing condition at the time of connecting the COF 3 and the TFT substrate 1 become equal thus ensuring the reliability of the terminal portions.

Figure 5:
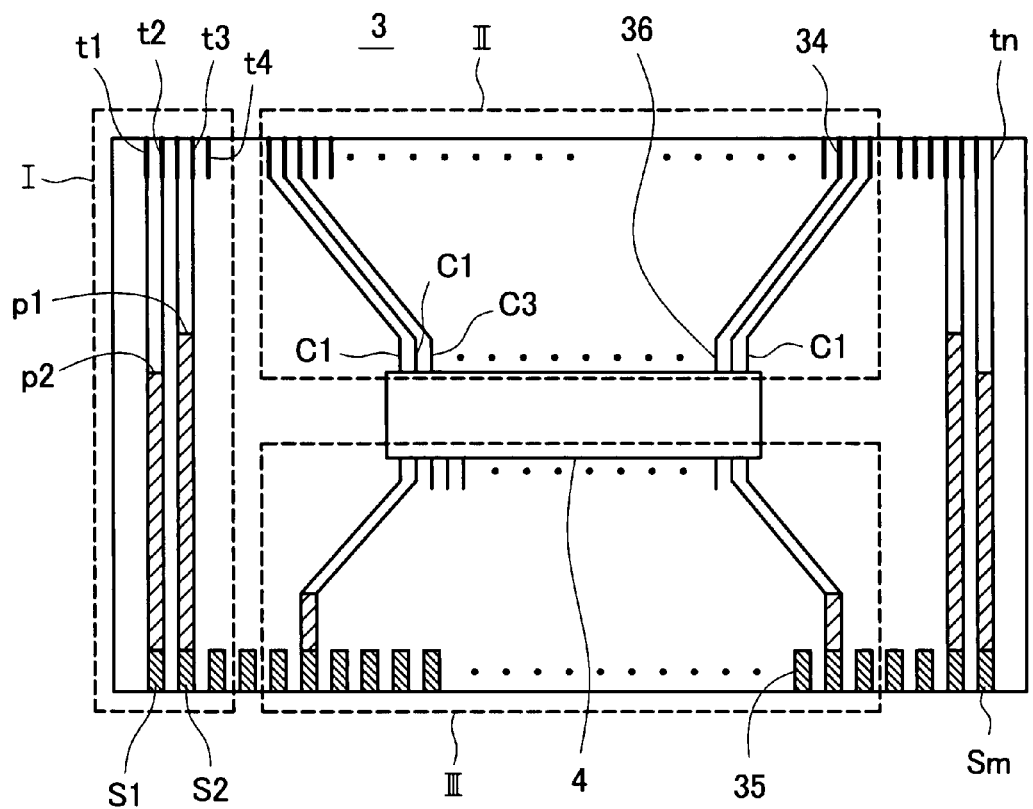
FIG. 5 is a schematic plan view of the COF.

FIG. 5 is a schematic plan view of the COF 3 in this embodiment. In FIG. 5, on the TFT-substrate-side terminal 34 of the COF 3 and the printed-circuit-board-side terminal 35 of the COF 3, the terminal portions having the same size are arranged at fixed pitches. The sizes of the terminals differ from each other between the TFT-substrate-side terminal 34 of the COF 3 and the printed-circuit-board-side terminal 35 of the COF 3. In FIG. 5, the lines formed on the COF 3 are branched into lines arranged in a region I, lines arranged in a region II and lines arranged in a region III. The region I of the COF 3 is a region in which the printed-circuit-board-side terminal 35 of the COF 3 and the TFT-substrate-side terminal 34 of the COF 3 are directly connected to each other without by way of the IC chip 4. The region II is a region in which lines which connect the IC chip 4 and the TFT-substrate-side terminal 34 of the COF 3 to each other are formed. The region III is a region in which lines which connect the IC chip 4 and the printed-circuit-board-side terminal 35 to each other are formed.

In FIG. 5, to compare the terminal pitches, the pitch of the TFT-substrate-side terminals t1 to tn of the COF 3 is set larger than the pitch of the IC-chip-side terminals c1 to cl. Further, the pitch of the TFT-substrate-side terminals t1 to tn of the COF 3 is set smaller than the pitch of the printed-circuit-board-side terminals s1 to sm of the COF 3.

In the region I shown in FIG. 5, the TFT-substrate-side terminal 34 of the COF 3 is linearly connected to the printed-circuit-board-side terminal 35 of the COF 3. However, in an actual constitution, for the purpose of avoiding or turning around other patterns formed in the inside of the COF 3, the TFT-substrate-side terminals 34 are not linearly connected with the printed-circuit-board-side terminal 35 of the COF 3. In the region I shown in FIG. 5, the terminals in the printed-circuit-board-side terminal 35 of the COF 3 are made smaller than the terminals of the TFT-substrate-side terminal 34 of the COF 3. The lines which extend from the TFT-substrate-side terminals t1, t2 of the COF 3 are put together to form a line which extends from the terminal s1 in the inside of the COF 3. The terminals t1, t2 are connected with corresponding terminals of the TFT substrate 1. Further, the TFT-substrate-side terminals t3, t4 of the COF 3 are also put together in the same manner to form a line which extends from the terminal s2 in the inside of the COF 3. In other words, the line from the terminal s1 is branched into two lines at a position p1. Further, the line from the terminal s2 is branched at a position p2. The positions p1, p2 differ from each other with respect to a distance from the TFT-substrate-side terminal 34 of the COF 3. Although only two lines extending from the positions s1, s2 are drawn in FIG. 5, in an actual constitution, three or more lines extend from the printed-circuit-board-side terminals in the same manner and their branching positions differ from each other. Due to such a constitution, when the COF 3 is bent in the direction parallel to the long side of the IC chip 4, bending stress is dispersed.

In the region II shown in FIG. 5, due to the relationship that the pitch of the TFT-substrate-side terminal 34 of the COF 3 and the pitch of the IC-chip-side terminal 36 differ from each other, the lines are bent at middle portions thereof such that the lines spread in the lateral direction as viewed from the IC chip 4. The region II is also described in a simplified manner, and there may be a case that the lines are branched as in the case of the region I also in the region II.

In the region III shown in FIG. 5, the lines which connect the IC-chip-side terminals 36 and the printed-circuit-board-side terminals 35 of the COF 3 are arranged. Here, the line is branched from the printed-circuit-board-side terminal 35 and, at the same time, the lines are bent in the vicinity of a branching point. Accordingly, in all regions, the lines are bent or branched.

Figure 6:
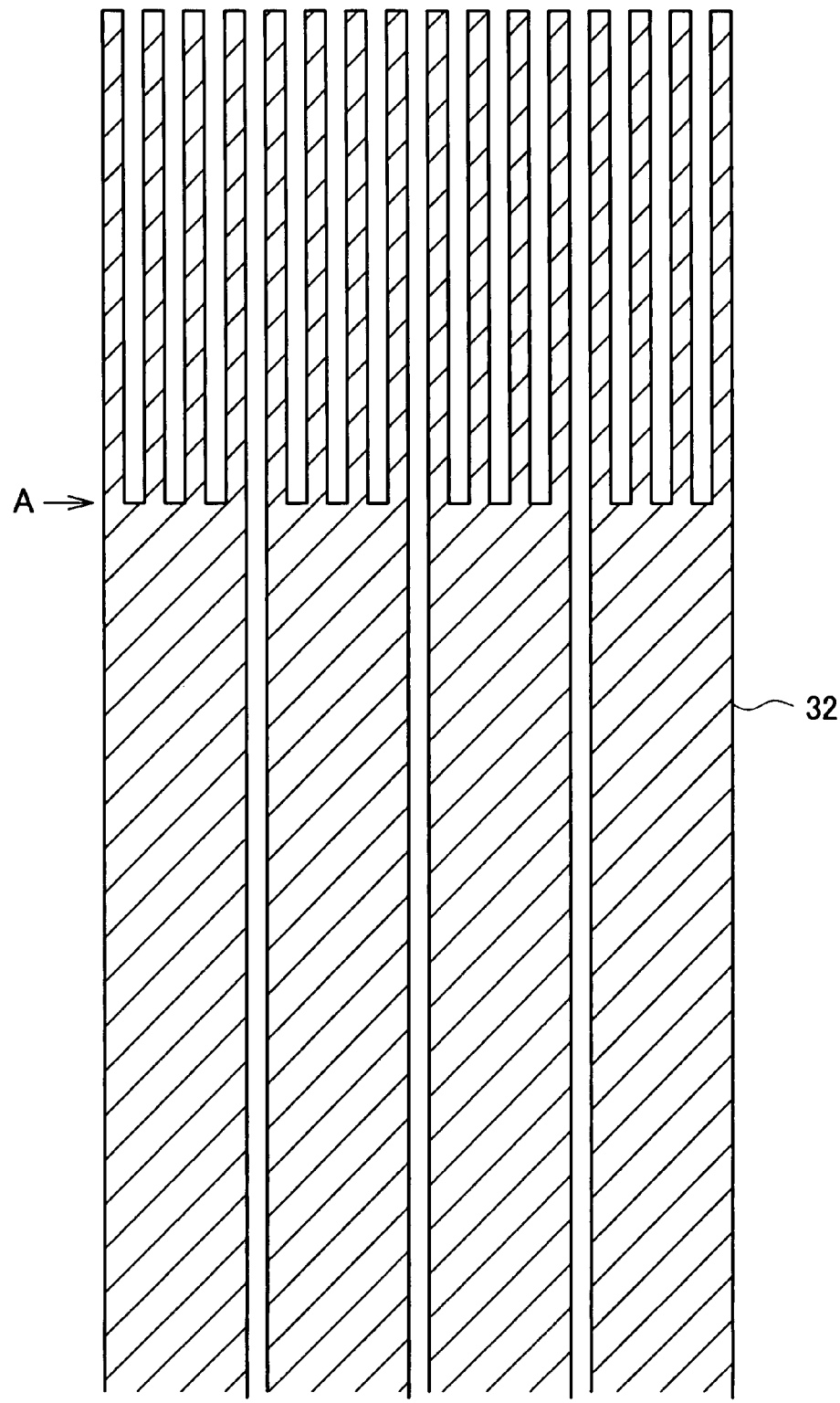
FIG. 6 is a wiring diagram showing a conventional example of a COF line.

FIG. 6 shows a drawback which arises when the line is branched. In FIG. 6, the base film 31, the protective film and the like of the COF 3 are omitted and only the copper lines 32 are described. In FIG. 6, the bold line extending from below is branched into four fine lines at a position A. Four bold lines are arranged in parallel in the drawing. As shown in FIG. 6, assuming that the bold lines are branched at the same position, when the COF 3 is bent, bending stress is concentrated on the position A and hence, a disconnection of the copper line or the like is liable to be easily generated at the position A. The present invention can enhance the reliability of the connection by preventing the concentration of the bending stress even when the COF 3 is bent in such a manner.

Figure 7:
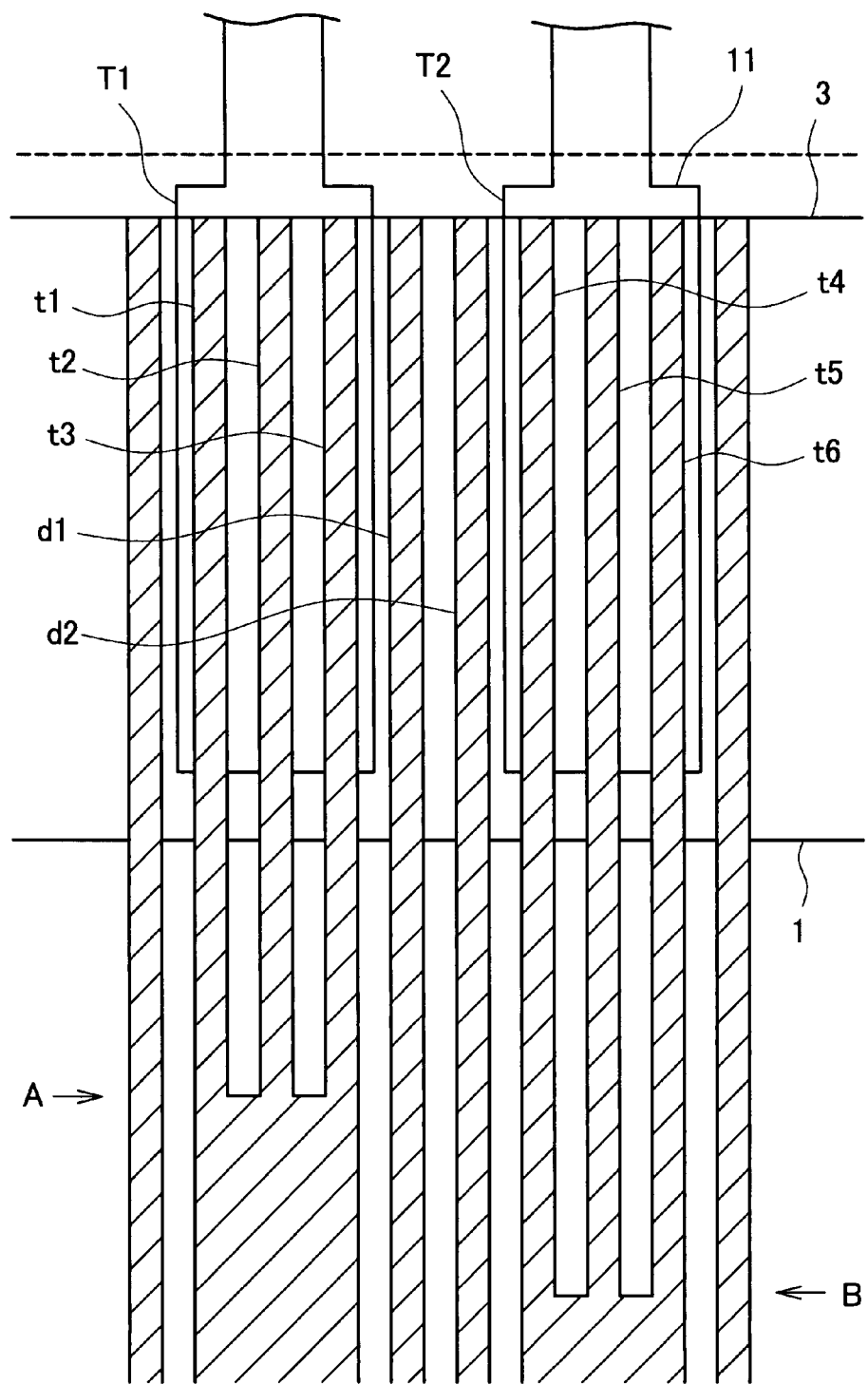
FIG. 7 is a plan view showing the connection of terminal portions of an embodiment 1.

FIG. 7 is an enlarged plan view showing a case in which the COF 3 is connected to the TFT substrate 1. In FIG. 7, the lines extend from an effective screen side of the liquid crystal display panel and are connected to the TFT substrate terminal portions. The COF 3 covers the TFT terminals by way of the anisotropic conductive film 7. In FIG. 7, the anisotropic conductive film 7 is omitted. In FIG. 7, the terminals t1, t2, t3 of the COF 3 are connected with the terminal T1 of the TFT substrate 1. The terminals t4, t5, t6 of the COF 3 are connected with the terminal T2 of the TFT substrate 1 with two dummy lines d1, d2 of the COF 3 sandwiched between the terminals t1, t2, t3 of the COF 3 and the terminals t4, t5, t6 of the COF 3. That is, a voltage having the same potential is supplied to the terminals t1 to t3, while another voltage having the same potential is supplied to the terminals t4 to t6.

In FIG. 7, the lines t1 to t3 are put together at the position A on the COF substrate to form a bold line. On the other hand, lines t4 to t6 are also put together at the position B to form a bold line. In this manner, by preventing the positions at which the fine lines are put together or the positions at which the bold line is branched from being arranged on one straight line or by displacing these positions from each other, when the COF 3 is bent, it is possible to prevent the disconnection of copper lines or the like attributed to the concentration of stress on the branched portion.

Figure 8:
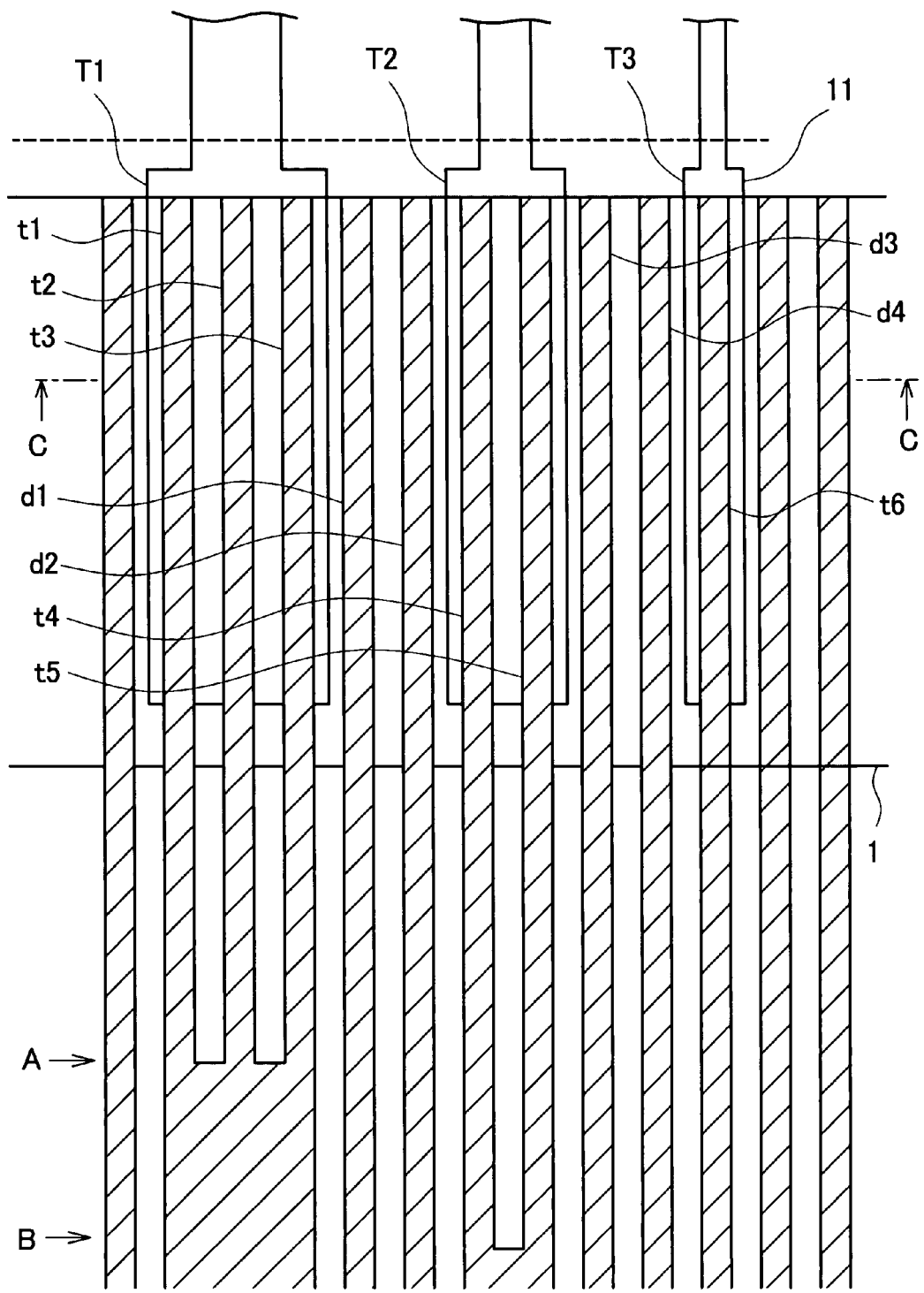
FIG. 8 is a plan view showing the connection of terminal portions in another mode of the embodiment 1.

FIG. 8 shows another example in which the COF 3 and the TFT substrate 1 are connected with each other. The sizes of the terminals formed on the TFT substrate 1 are not always the same and often differ due to the signals, the power sources and the like to be supplied. That is, the terminal which supplies a large electric current such as the power source is made large-sized to reduce the electric resistance, while an electric current for data signals or the like is extremely weak and hence, it is sufficient to form the terminal for data signals or the like using a small-sized terminal. FIG. 8 shows an example in which the terminals which differ in size are arranged on the TFT substrate 1.

In FIG. 8, the terminal T1 on the TFT substrate 1 has a largest width, and the terminals t1, t2, t3 of the COF 3 correspond to the terminal T1. That is, the same potential is supplied to the terminal T1 from the terminals t1, t2, t3. The terminals t3, t4 on the COF 3 correspond to the terminal T2 on the TFT substrate 1. The terminal T3 on the TFT substrate 1 has a smallest width, and only one terminal t6 on the COF 3 correspond to the terminal T3.

The terminals t1, t2, t3 on the COF 3 are put together to form one bold line at a position A shown in FIG. 8. Further, the terminals t4, t5 on the COF 3 are put together to form one bold line at a position B shown in FIG. 8. As shown in FIG. 8, even when the number of fine lines branched from the bold line differ among these bold lines, by making the branching positions differ from each other, it is possible to prevent the concentration of stress when the COF 3 is bent. Further, in FIG. 8, between the terminals T1, T2 and T3 of the TFT substrate 1, two dummy lines of the COF 3 are arranged. However, it is not always necessary to arrange two dummy lines and the number of dummy lines may be one or the dummy lines may be eliminated. This is because the dummy lines are mainly provided for making the thermocompression bonding conditions uniform at the time of performing the thermocompression bonding of the COF 3 and the TFT substrate 1 by way of the anisotropic conductive film 7.

Figure 9:
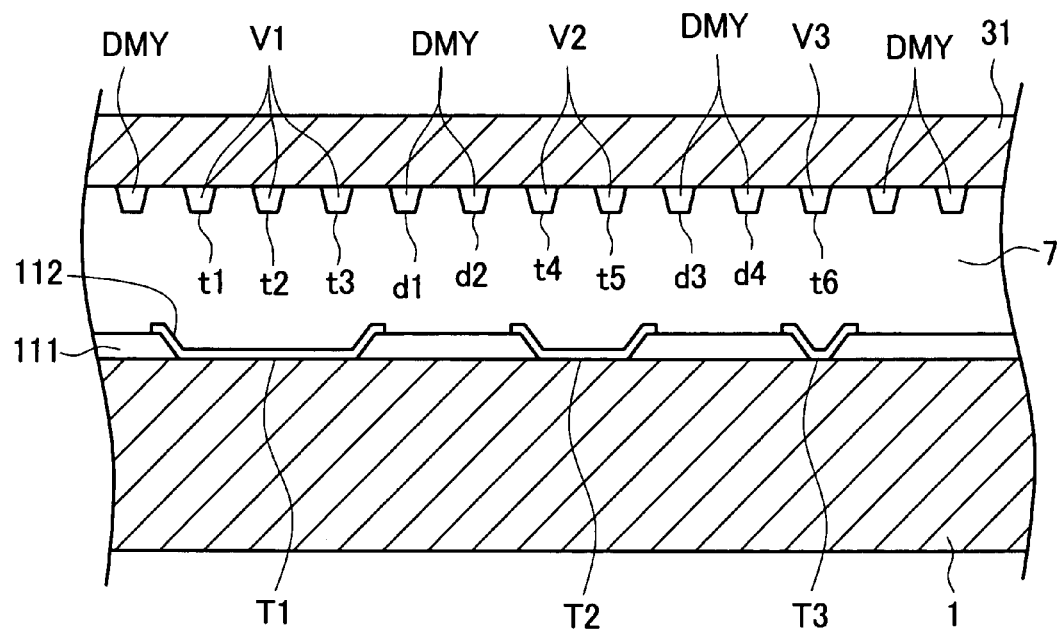
FIG. 9 is a cross-sectional view showing the connection of the terminal portions of the embodiment 1.

FIG. 9 is a cross-sectional view taken along a line C-C in FIG. 8. FIG. 9 shows a state in which terminal portions are formed using an ITO film 112 in opening portions formed in a passivation film on the TFT substrate 1. The terminals t1, t2, t3 of the COF 3 formed on the COF 3 are connected to the terminal T1 on the TFT substrate 1 by way of the anisotropic conductive film 7. To facilitate the understanding of the drawing, a thickness of the anisotropic conductive film 7 is drawn in an enlarged manner.

A potential V1 which allows a flow of a large current such as a power source is applied to the large terminal T1 on the TFT substrate 1 by way of the terminals t1, t2, t3 of the COF 3. The terminals t4, t5 of the COF 3 which are formed with the dummy lines d1, d2 sandwiched between the terminals t1, t2, t3 of the COF 3 and the terminals t4, t5 of the COF 3 are connected to the terminal T2 by way of the anisotropic conductive film 7. Further, the terminal t6 of the COF 3 which is formed with the dummy lines d3, d4 sandwiched between the terminals t4, t5 of the COF 3 and the terminals t6 of the COF 3 are connected to the terminal T3 on the TFT substrate 1 by way of the anisotropic conductive film 7. A voltage V3 which allows a flow of a small electric current such as data signals while preventing a flow of a large current is supplied to the terminal T3.

Figure 10:
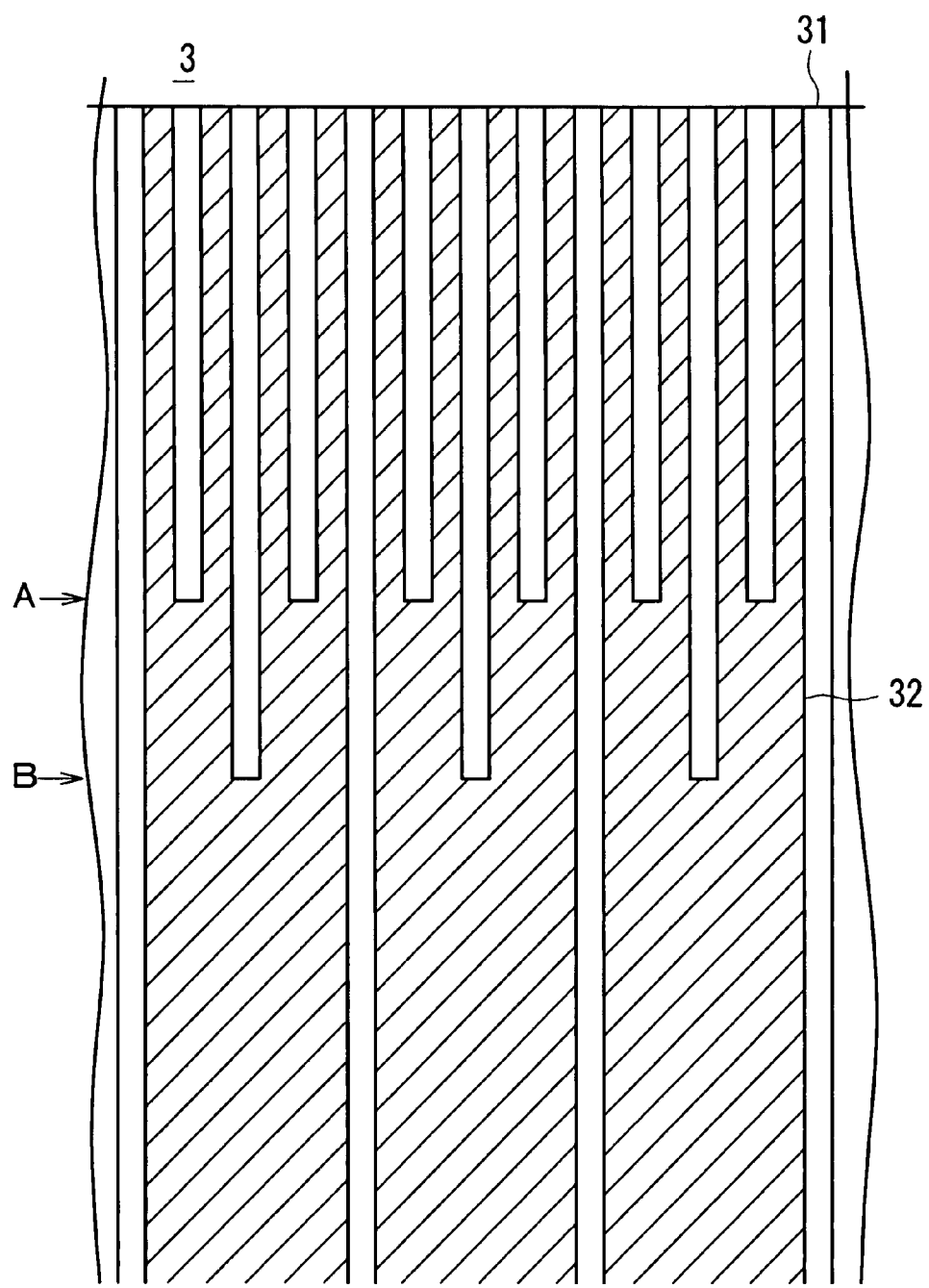
FIG. 10 is a plan view of a COF of the embodiment 1.

FIG. 10 is an enlarged plan view showing another mode of lines of terminal portions of the COF 3 of the embodiment 1. In FIG. 10, each of copper lines 32 having a large width which are formed on a base film 31 of the COF 3 is branched into four fine lines at portions where the COF 3 is connected with the terminal portions of the TFT substrate 1. First of all, the bold line is branched into two lines at a position B, and two branched lines are further branched at a position A. A total width of the each line is decreased along with the number of times of branching. Accordingly, although the concentration of bending stress is generated on the branching positions when the COF 3 is bent, by dispersing the branching positions as shown in FIG. 10, bending stress can be dispersed and hence, the disconnection or the like of lines attributed to the bending stress generated by the stress concentration can be prevented.

Figure 11:
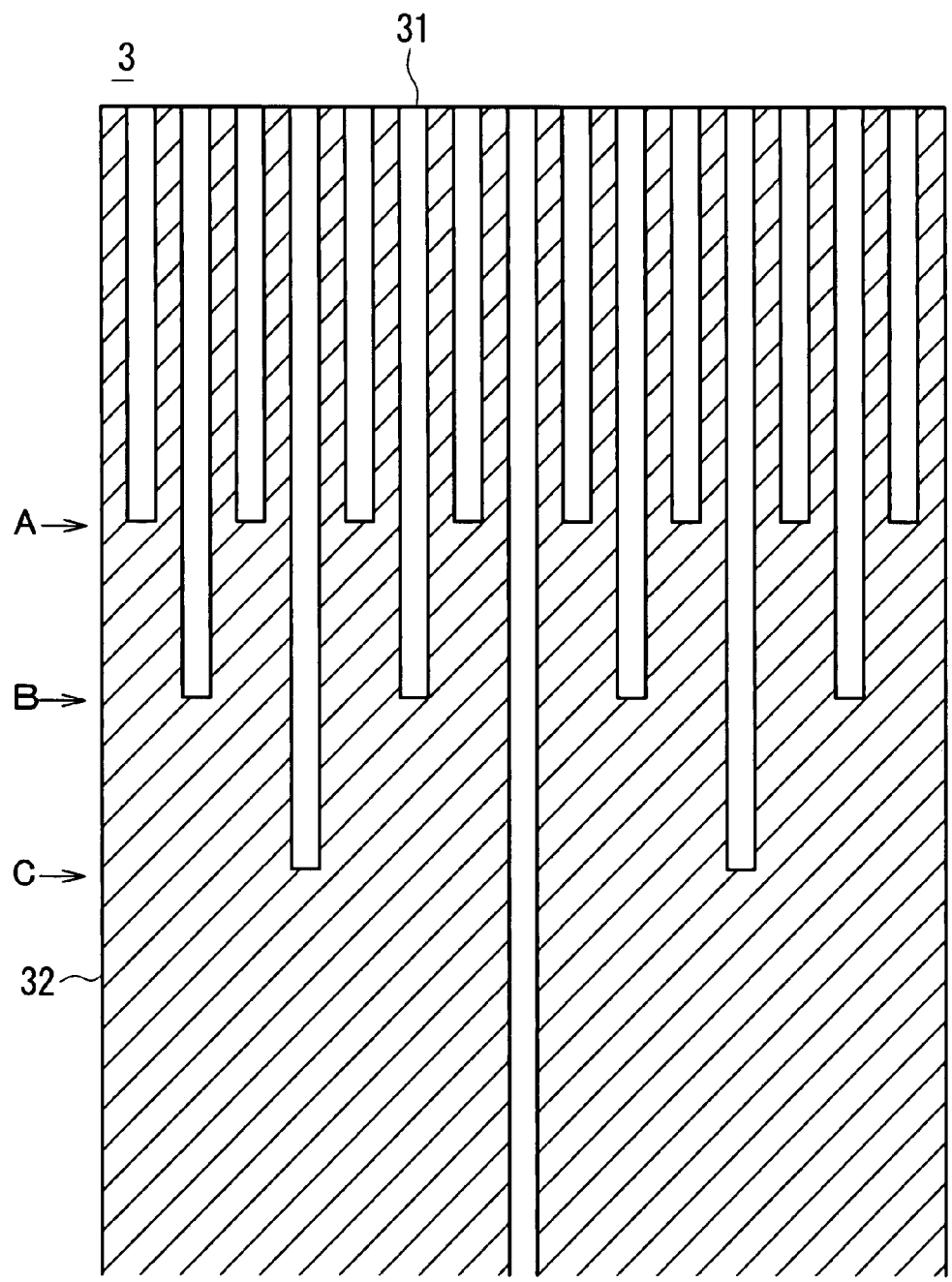
FIG. 11 is a plan view of the COF in another mode of the embodiment 1.

FIG. 11 shows a case in which eight fine lines are branched from bold lines on the COF 3. Eight fine lines are connected to the same terminal portion of the TFT substrate 1. The bold line of the COF 3 is firstly branched into two lines at a position C, each branched portion is further branched into two lines at a position B, and each branched portion is still further branched into two fine lines at a position A. In the case shown in FIG. 11, when the COF 3 is bent, stress is dispersed at three positions consisting of the position A, the position B and the position C and hence, the stress concentration can be further avoided compared to the case shown in FIG. 10. Accordingly, a possibility of disconnection of lines or the like can be further reduced.

Figure 12:
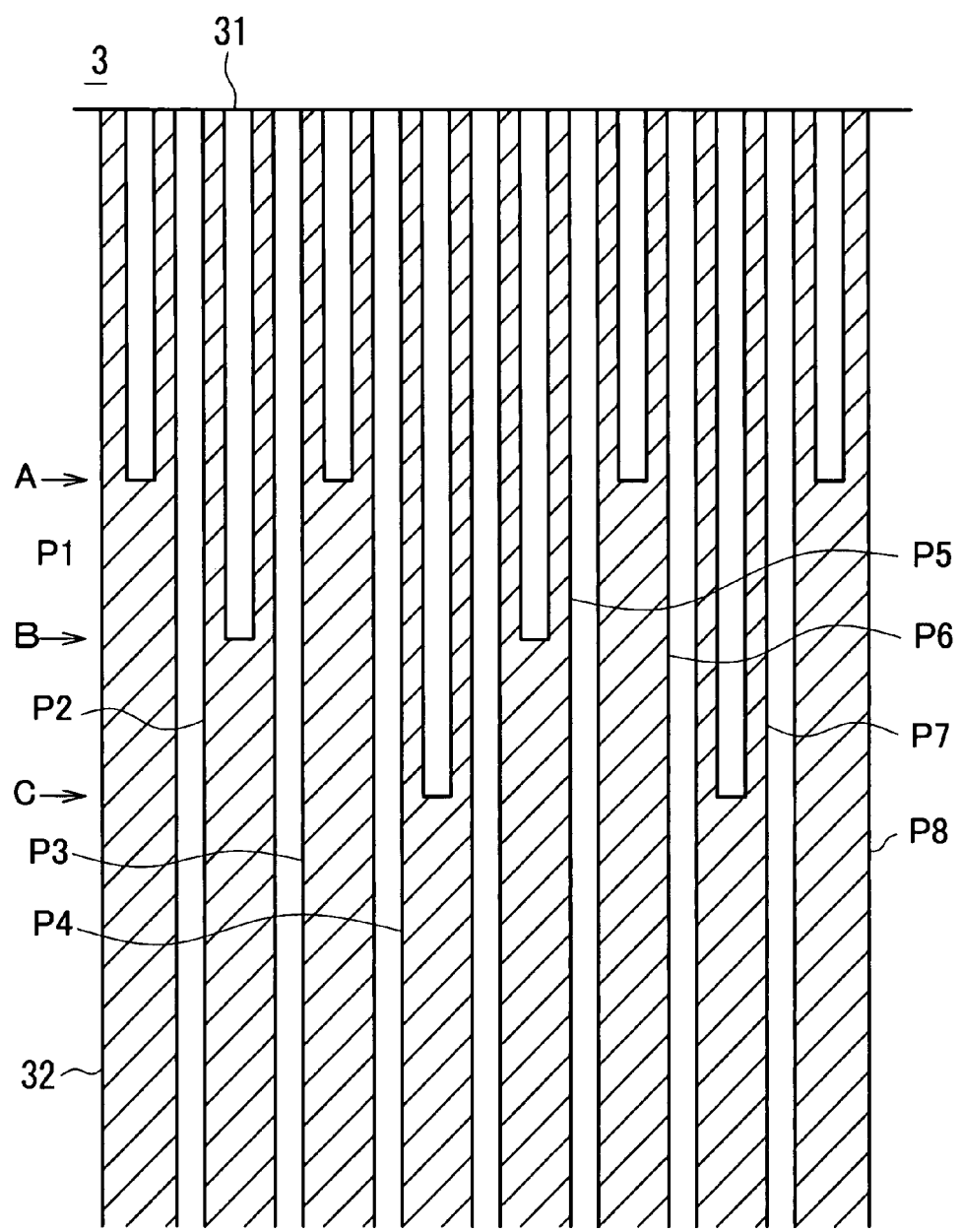
FIG. 12 is a plan view of the COF in still another mode of the embodiment 1.

FIG. 11 shows the case in which eight fine lines are branched from one bold line and the positions at which the fine lines are branched are made different from each other. A technical concept of this embodiment is not limited to a case in which the fine lines are branched from the same line. FIG. 12 shows a case in which a bold line is branched into two lines and the concentration of bending stress is suppressed by dispersing branching positions. In FIG. 12, lines P1, P3 and the like are branched at a position A, lines P2, P5 and the like are branched at a position B, and lines P4, P7 and the like are branched at a position C. Due to such a constitution, the bending stress which is generated when the COF 3 is bent is dispersed at threes positions consisting of the position A, the position B and the position C. Accordingly, it is possible to prevent the disconnection or the like of the lines attributed to the concentration of the bending stress. Although the explanation has been made with respect to the case in which the number of branching positions is two or three in the above-mentioned embodiment, the number of branching positions may be four or more. In this case, the dispersion of the bending stress is further enhanced.

Embodiment 2

Figure 13:
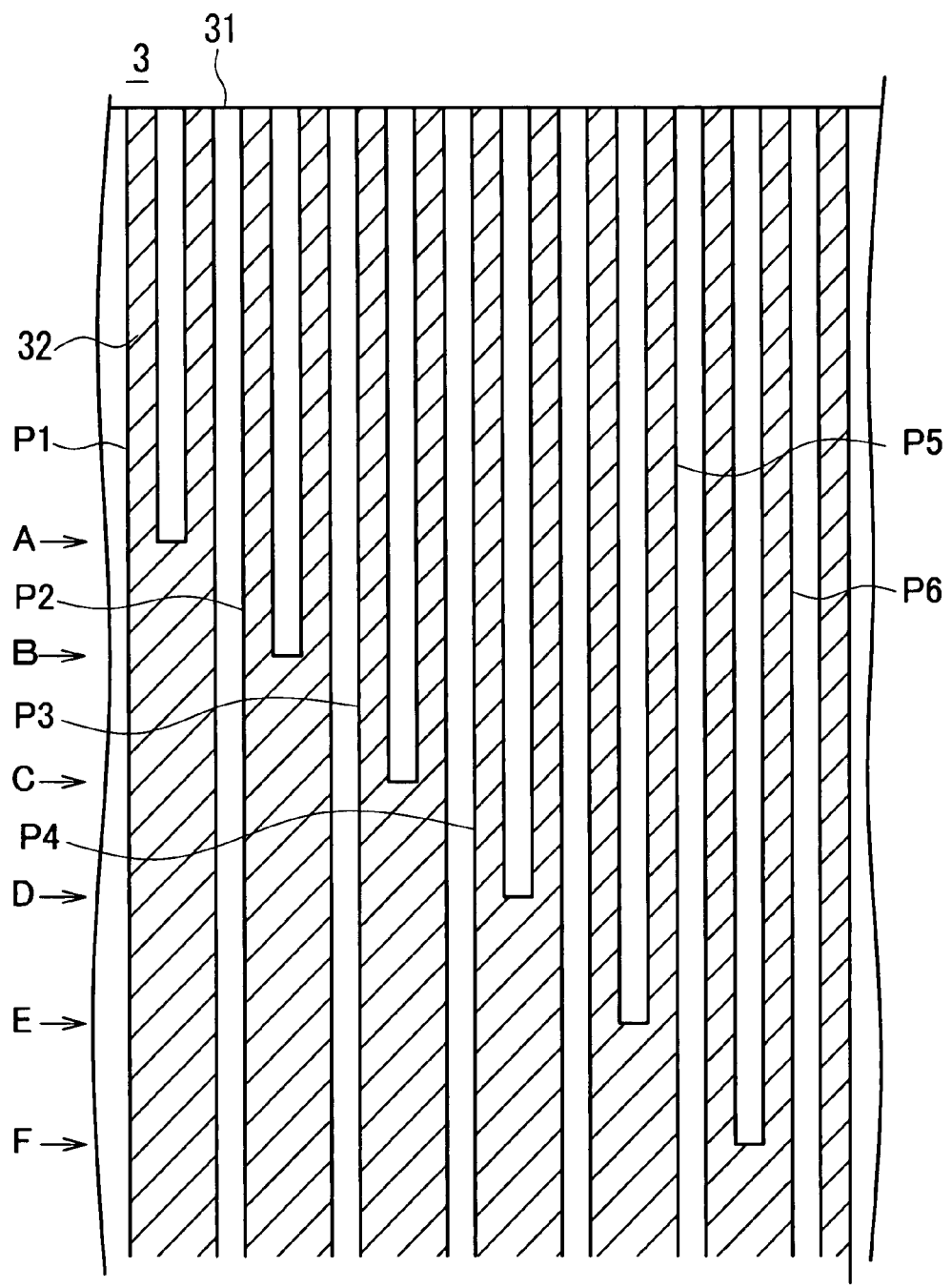
FIG. 13 is a plan view of a COF of an embodiment 2.

In the embodiment 1, the explanation is made with respect to the case in which the branching positions of the bold lines are provided in plural number and the branching positions are regularly changed for every line. In the embodiment 2, the explanation is made with respect to the case in which the branching positions are continuously changed for respective neighboring fine lines. In FIG. 13, the respective bold lines on the COF 3 are branched into two fine lines. The branching positions are gradually arranged away from the TFT-substrate-side terminal 34 of the COF 3 such that the branching position of the line P1 is set at a position A, the branching position of the line P2 is set at a position B, and the branching position of the line P3 is set at a position C. By dispersing the branching positions in this manner, it is possible to disperse bending stress when the COF 3 is bent.

Figure 14:
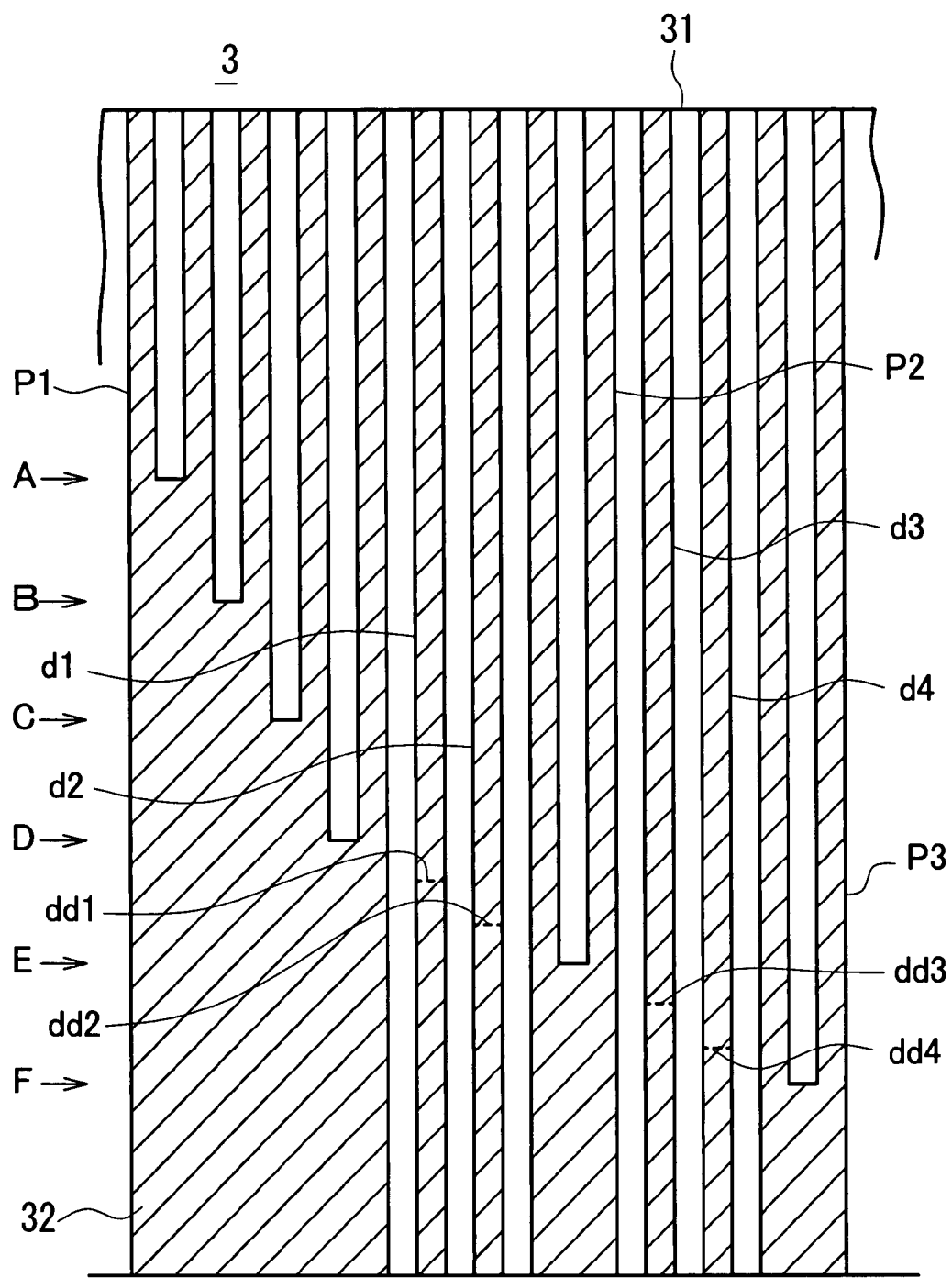
FIG. 14 is a plan view of the COF in another mode of the embodiment 2.

In FIG. 13, although the explanation is made with respect to the case in which the positions where the bold lines having the same width are branched into fine lines respectively are continuously changed, the continuous changing of branching positions is not limited to the lines having the same width. FIG. 14 shows a case in which branching positions of lines are changed when the lines having different line widths are provided in mixture.

FIG. 14 shows the case in which a line P1 is configured such that a bold line is branched into five fine lines. In the line P1, the branching positions are continuously changed within the same line such that one fine line is branched at a position D, another one fine line is branched at a position C, another one fine line is branched at a position B, and still another one fine line is branched at a position A. A line P2 is arranged with two dummy lines d1, d2 sandwiched between the line P1 and the line P2. The line P2 is branched at a position E. The position E at which the line P2 is branched is arranged more away from an end portion of the COF 3 than the branching position D of the line P1. A line P3 is arranged with two dummy lines d3, d4 sandwiched between the line P2 and the line P3. The line P3 is branched at a position F. The position F at which the line P3 is branched is arranged more away from an end portion of the COF 3 than the branching position D of the line P1. In this manner, it is possible to continuously change the branching positions even within one bold line and, at the same time, it is possible to continuously change branching positions even when the widths of the lines differ from each other.

In FIG. 14, two dummy lines d1, d2 are arranged between the lines P1, P2 and two dummy lines d3, d4 are arranged between the lines P2, P3. The dummy lines are provided for making the condition of thermocompression bonding uniform at the time of connecting the COF 3 and the terminal of the TFT substrate 1. To consider the alleviation of bending stress at the branched portion by branching the line, in general, it is preferable to leave the dummy lines besides the terminal portions. On the other hand, when it is desirable to continuously change the branching positions, the dummy lines may be terminated at positions dd1, dd2, dd3, dd4 indicated by dotted lines shown in FIG. 14, for example.

Figure 15:
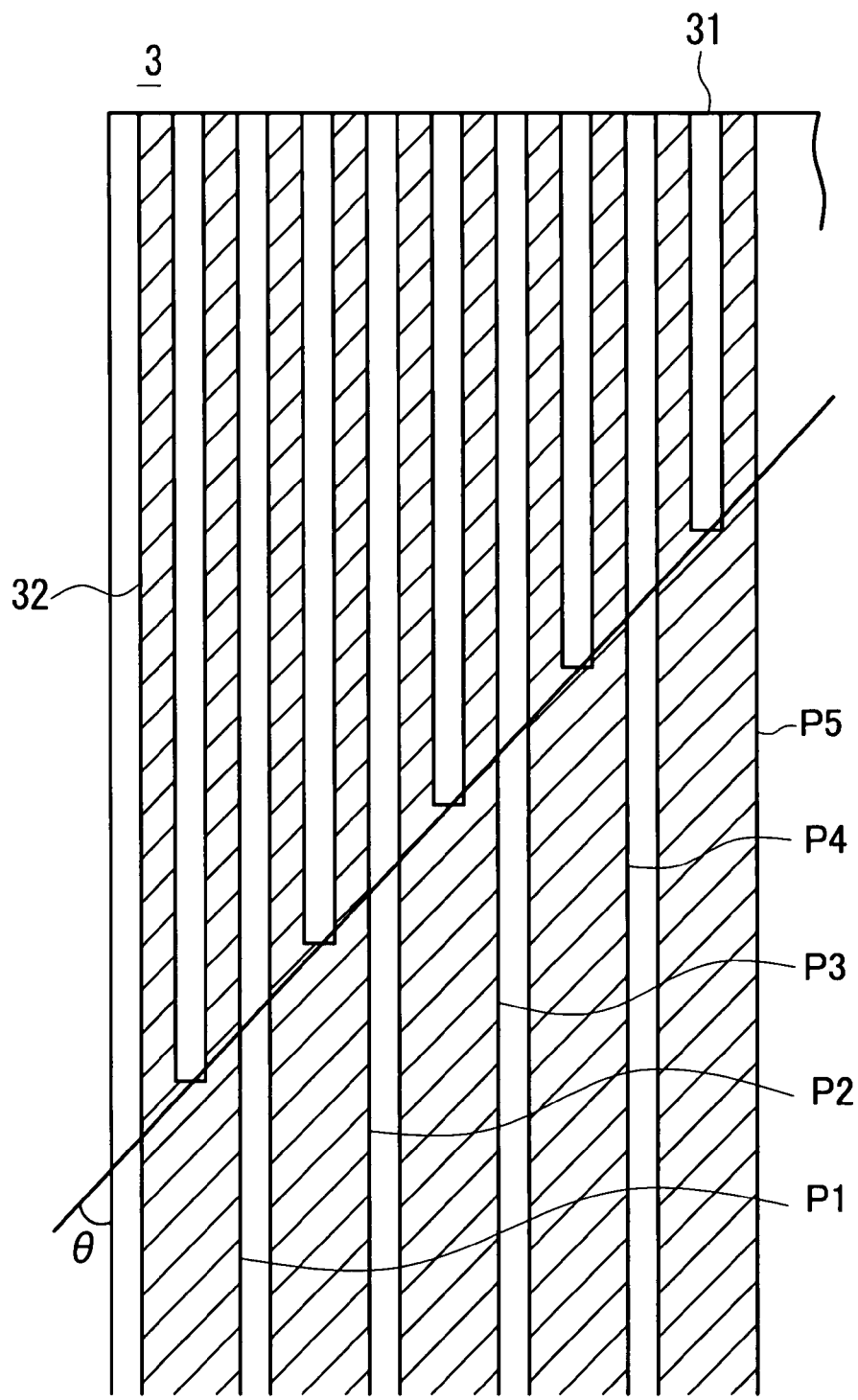
FIG. 15 is a plan view of the COF in still another mode of the embodiment 2.

In continuously changing the branching positions, by arranging the changing branching positions in the specific direction, it is possible to further increase the bending stress suppression effect. FIG. 15 is a preferred example of the changing direction of the branching positions. In FIG. 15, an envelope of line branching positions of the lines P1, P2, P3, P4, P5 intersects a side end portion of the COF 3 at an angle θ. The angle θ is smaller than 90°. This angle is set such that the branching position of the line arranged outside is arranged more away from the TFT-substrate-side terminal 34 of the COF 3 than the branching position of the line arranged inside the line arranged outside. By changing the branching positions as shown in FIG. 15, it is possible to prevent the concentration of the bending stress on the fine lines after branching thus preventing the disconnection of the lines.

Embodiment 3

Figure 16:
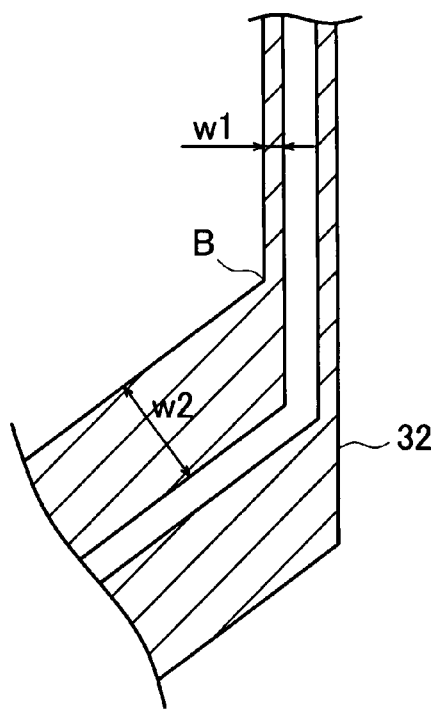
FIG. 16 is a schematic plan view showing an example in which lines are bent.

On the COF 3, it is a rare case that the lines are linearly formed from the TFT-substrate-side terminal 34 of the COF 3 to the printed-circuit-board-side terminal 35 of the COF 3 and, in general, the lines are bent in the midst portions thereof. Further, in bending the lines, line widths are also often changed simultaneously. There are various methods for bending the lines in such a case. The simplest way is a method shown in FIG. 16. In this method, as shown in FIG. 16, a line having a width of w1 is bent and, thereafter, the width of the line is changed to w2. In FIG. 16, the width of the fine line before bending is set to a fixed value of w1. Further, the width of the bold line after bending is also set to a fixed value of w2. However, in this case, since the width sharply changes at a bending portion of the line and hence, when the COF 3 is bent, a disconnection is liable to easily occur at a line bending portion, for example, at a portion B shown in FIG. 16, for example. This embodiment is provided for preventing such a disconnection at such a line bending portion.

Figure 17:
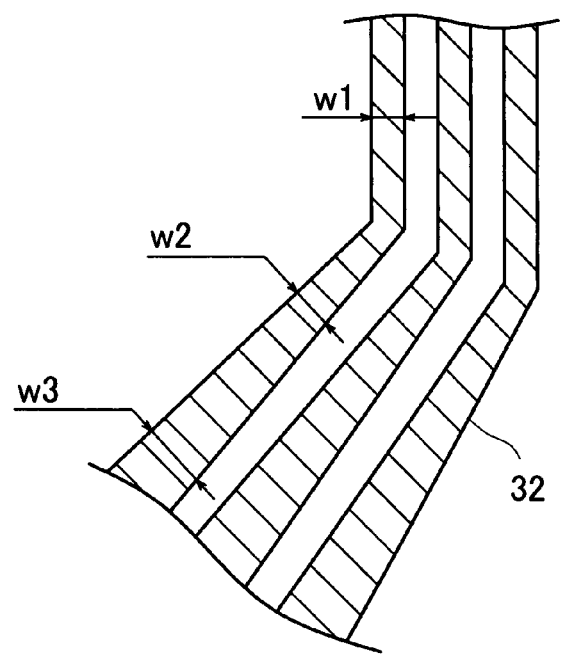
FIG. 17 is a schematic plan view showing an example in which lines are bent in an embodiment 3.

FIG. 17 shows one mode of this embodiment. Fine lines have a fixed width of w1 in FIG. 17. A width of the line is increased along with bending of the line. In this embodiment, the width of the line after bending is gradually increased such that the width is increased from w2 to w3 as shown in FIG. 17, for example. Due to such a change of the width of the line, even when the COF 3 is bent or the like, the concentration of stress on a bending portion of the line can be prevented thus preventing the disconnection of the line.

Figure 18:
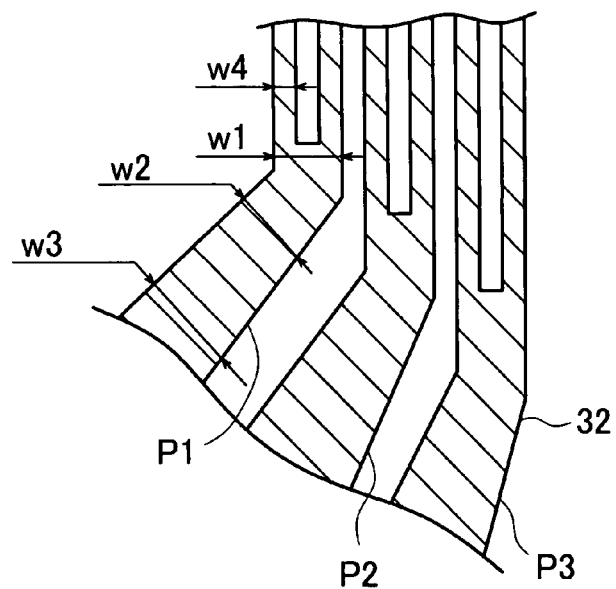
FIG. 18 is a schematic plan view showing an example in another mode in which the lines are bent in the embodiment 3.

Although FIG. 17 shows a case in which the lines are not branched, the same idea is applicable to a case in which the lines are branched. FIG. 18 shows a case in which the lines are branched and are bent. In FIG. 18, each line P1, P2, P3 is branched into two fine lines having a width of w1. The branching positions of the lines P1 to P3 are set remoter from the TFT-substrate-side terminal 34 of the COF 3 in order of the lines P1 to P3. Each line has the width thereof gradually decreased from w3 to w2 before being bent or before being branched. Due to such a constitution, it is possible to prevent the concentration of stress attributed to branching when the COF 3 is bent and the concentration of stress attributed to bending of the lines.

Figure 19:
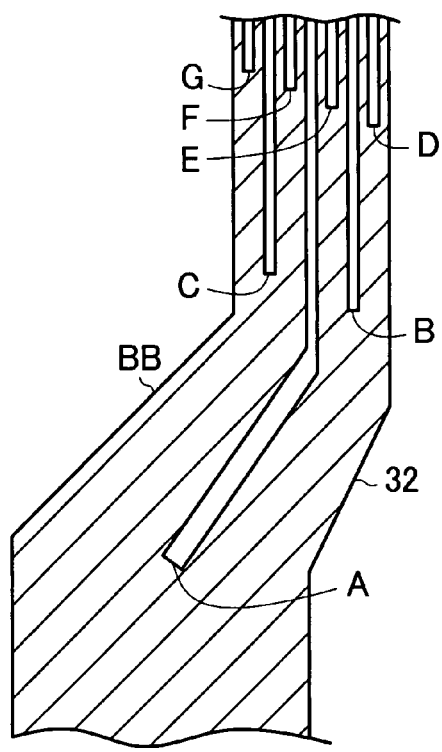
FIG. 19 is a schematic plan view showing the combination of the embodiments of the present invention.

FIG. 19 is a view showing a constitutional example of a case in which eight fine lines are branched from one line having a large width. To prevent the concentration of bending stress when the COF 3 is bent due to branching, all horizontal positions of branching positions A to G are made different from each other. Further, at a BB portion of the line after bending, a width of the line is gradually changed to prevent the concentration of stress on the bent portion and, at the same time, to disperse bending stress.

Embodiment 4

In the embodiment 1 to the embodiment 3, the explanation has been made with respect to the liquid crystal display module which is used in the liquid crystal display device for a television receiver set shown in FIG. 1 or the like. That is, the embodiment 1 to the embodiment 3 adopt, as shown in FIG. 2 and FIG. 3, the constitution which connects the COF 3 between the TFT substrate 1 and the printed circuit board 6. However, in a miniaturized liquid crystal display device such as a liquid crystal display device used in a mobile phone, the constitution adopted by the embodiments 1 to 3 is not adopted. That is, an IC chip or the like is directly mounted on a TFT substrate 1 of a liquid crystal display panel.

Figure 20:
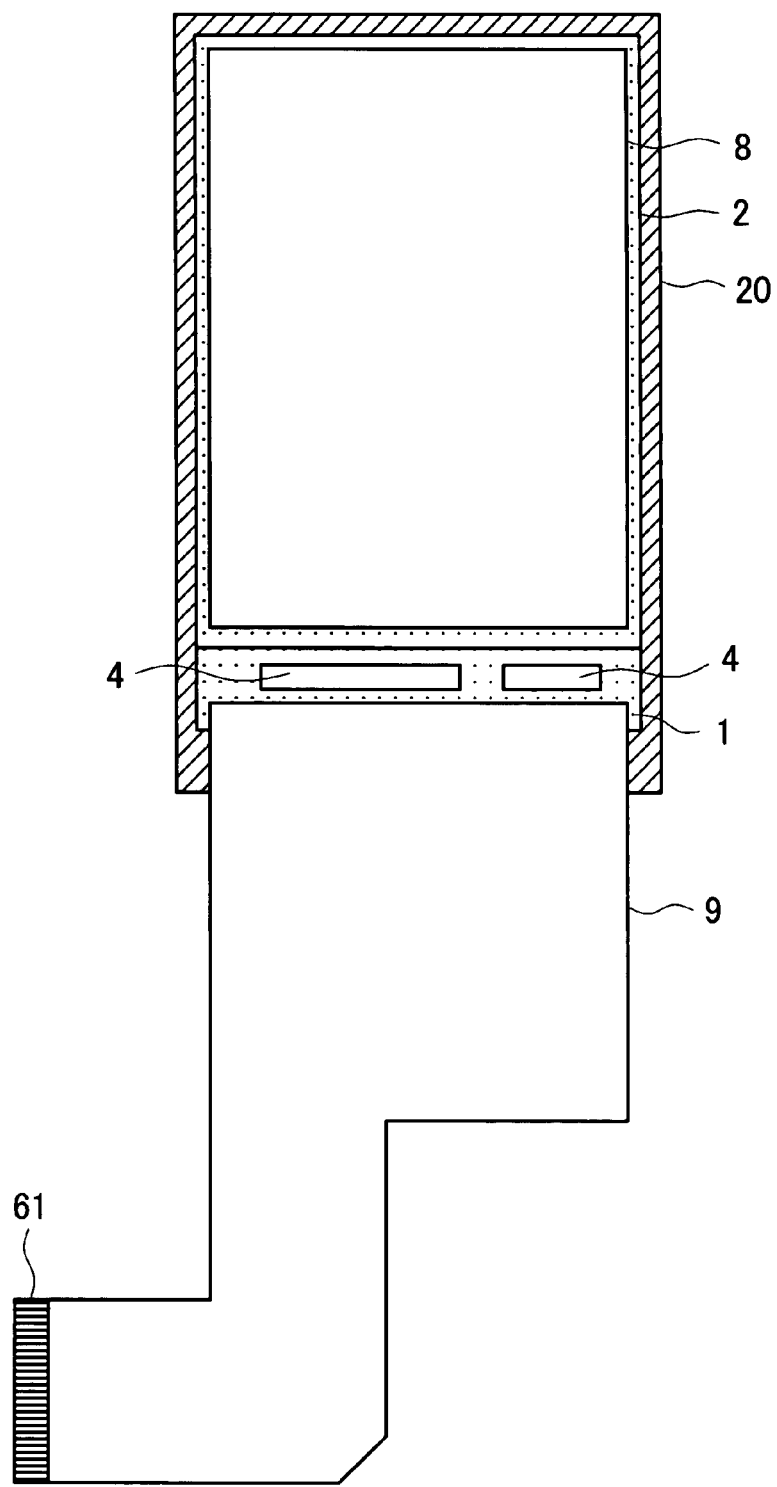
FIG. 20 is a is a plan view of another liquid crystal display device to which the present invention is applied.

FIG. 20 shows a step in the midst of manufacturing a miniaturized liquid crystal display device used in a mobile phone or the like. In FIG. 20, a TFT substrate 1 and a color filter substrate 2 are arranged to overlap each other. Since an IC chip 4 for driving liquid crystal and a terminal portion for mounting a flexible printed circuit board 9 are mounted on the TFT substrate 1, the TFT substrate 1 is formed larger than the color filter substrate 2. On the color filter substrate 2, an upper polarizer 8 is mounted. Although not shown in the drawing, a lower polarizer is mounted on the TFT substrate 1. These parts are housed in a mold 20 formed of a resin.

The flexible printed circuit board 9 is mounted on the terminal portion of the TFT substrate 1. On the flexible printed circuit board 9, besides an LED which constitutes a light source used as a backlight, a large number of parts are mounted and various kinds of lines are formed. On one end portion of the flexible printed circuit board 9, an external connection terminal 61 for connection with an external power source, a host computer and the like is formed.

Figure 21:
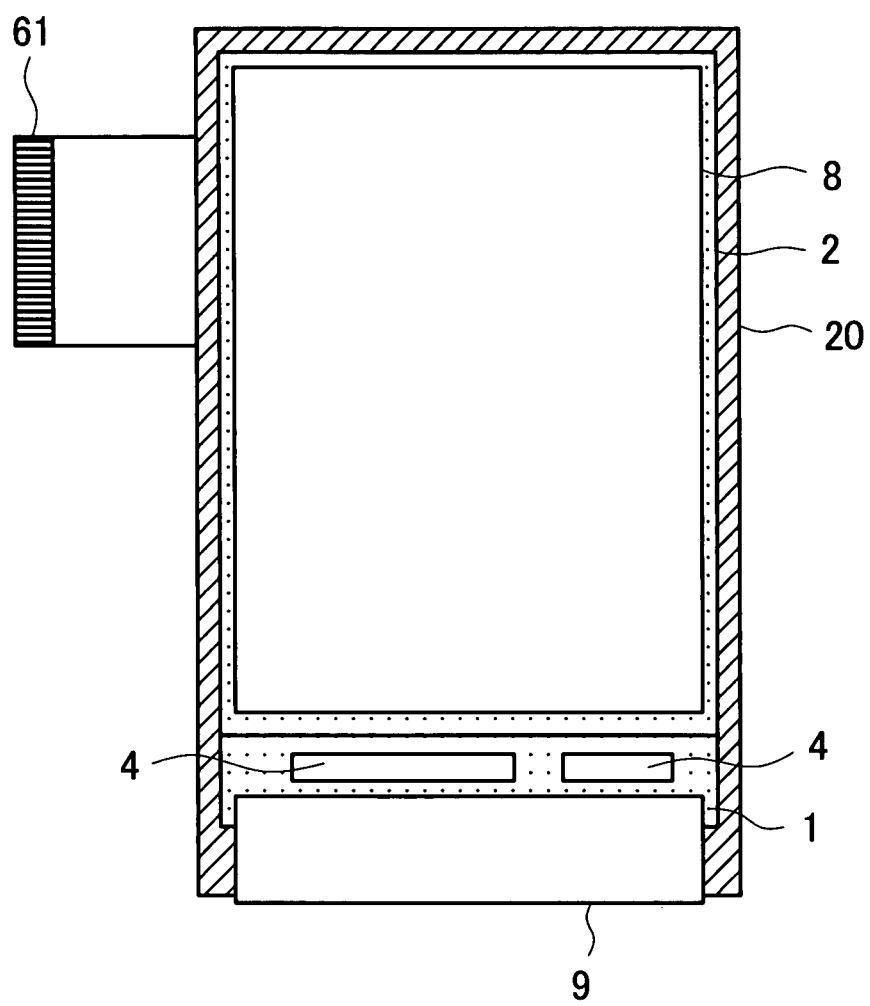
FIG. 21 is another plan view of another liquid crystal display device to which the present invention is applied.

So long as the flexible printed circuit board 9 holds a flat posture, the flexible printed circuit board 9 occupies a space. Accordingly, the flexible printed circuit board 9 is bent on a back surface of the liquid crystal display panel. FIG. 21 is a plan view which shows a state after the flexible printed circuit board 9 is bent. The flexible printed circuit board 9 is bent toward a back surface of the liquid crystal display panel in a form that a side portion of the mold 20 is surrounded by the flexible printed circuit board 9. The connection between the flexible printed circuit board 9 and the terminal portion of the TFT substrate 1 is also established in the same manner as the above-described connection between the COF 3 and the terminal portion of the TFT substrate 1. That is, the terminal portion of the TFT substrate 1 and the flexible printed circuit board 9 are connected with each other by arranging an anisotropic conductive film 7 between the terminal portion of the TFT substrate 1 and the flexible printed circuit board 9, and by performing thermocompression bonding by pushing an upper surface of the flexible printed circuit board 9 using a thermal head. Accordingly, to make conditions at the time of performing the thermocompression bonding uniform, in the same manner as the cases explained in conjunction with the embodiment 1 to the embodiment 3, this embodiment also adopts the constitution in which fine lines are arranged at a fixed pitch in a portion of the flexible printed circuit board 9 which corresponds to the TFT terminal portion and a plurality of fine lines of the flexible printed circuit board 9 is made to correspond to large terminals of the TFT substrate 1.

In this manner, in the miniaturized liquid crystal display device, drawbacks explained in conjunction with the embodiment 1 to the embodiment 3 such as the use of the flexible printed circuit board 9 in a bent state, the presence of branching positions from the bold line into the fine lines, the complicated arrangement of lines and the like exist. Further, a size of a cross section of the flexible printed circuit board 9 is substantially equal to a size of a cross section of the COF 3. Accordingly, the constitution of the present invention explained in conjunction with the embodiment 1 to the embodiment 3 is also applicable to the liquid crystal display device which directly connects the flexible printed circuit board 9 to the TFT substrate 1.

The present invention has been explained in conjunction with the liquid crystal display device heretofore. However, an organic EL display device also has drawbacks which are explained in conjunction with the above-mentioned liquid crystal display device such as the connection of the COF 3 or the flexible printed circuit board 9 with the terminal of the substrate, the use of the COF 3 or the flexible printed circuit board 9 in a bent state, the connection of the COF 3 or the flexible printed circuit board 9 with the TFT substrate 1 by thermocompression bonding, the presence of lines which differ in an electric current such as power source lines or signal lines and the like in the organic EL display device also exist as it is. Accordingly, the constitution of the present invention explained in conjunction with the embodiment 1 to the embodiment 4 is directly applicable to the organic EL display device.

In an FED, the lines or terminals which differ in current capacitance such as scanning signal lines or data signal lines are present and the printed circuit board and the like are used. Accordingly, the FED also has the above-mentioned drawbacks and hence, the constitution of the present invention is applicable to the FED.

What is claimed is:

1. A flat display device which mounts pixels on a substrate thereof in a matrix array, wherein
a plurality of terminals for connection with an external circuit is formed on an end portion of the substrate, a wiring film which is formed by mounting a plurality of first lines on an insulation film is connected to the plurality of terminals, and the wiring film includes a side portion which is connected with the plurality of terminals,
the plurality of first lines to be connected with the plurality of terminals is formed on the wiring film, and
each first line of the plurality of first lines is, on a side portion at which the first lines are connected with the plurality of terminals, branched into a plurality of second lines that are parallel to the first line, and distances of positions at which the first lines of the plurality of first lines are branched from the side portion differ from each other depending on the first lines.

2. A flat display device according to claim 1, wherein the second lines of the wiring film are connected to each of the plurality of the terminals.

3. A flat display device according to claim 1, wherein each first line of the plurality of first lines includes three or more branching positions, and, for each first line, the branching positions differ from each other in terms of distance from the side portion.

4. A flat display device according to claim 1, wherein a dummy line which is not connected to the terminal of the substrate is formed between the plurality of first lines.

5. A flat display device according to claim 1, wherein the wiring film is bent along a side portion of the flat display device.

6. A flat display device according to claim 1, wherein an IC chip is mounted on the wiring film.

7. A flat display device according to claim 1, wherein the flat display device is a liquid crystal display device.

8. A flat display device according to claim 1, wherein the flat display device is an organic EL display device.

9. A flat display device according to claim 1, wherein the flat display device is a field emission display.

10. A flat display device which mounts pixels on a substrate thereof in a matrix array, wherein
a plurality of terminals for connection with an external circuit is formed on an end portion of the substrate, a wiring film which is formed by mounting a plurality of first lines on an insulation film is connected to the plurality of terminals, and the wiring film includes a side portion which is connected with the plurality of terminals,
the plurality of first lines to be connected with the plurality of terminals is formed on the wiring film, and
each first line of the plurality of first lines is, on a side portion at which the first lines are connected with the plurality of terminals, branched into a plurality of second lines that are parallel to the first line and have narrower widths than a width of the first line, and distances of positions at which the first lines of the plurality of first lines are branched from the side portion differ from each other depending on branching positions, and the distances are changed in order from the outermost branching position of the wiring film.

11. A flat display device according to claim 10, wherein each of the plurality of lines includes three or more branching positions, and the neighboring branching positions in the same line are set such that the distances from the side portion are changed in order from the outermost branching position on the same line.

12. A flat display device according to claim 10, wherein a dummy line which is not connected to the terminal of the substrate is formed between the plurality of first lines, and the dummy line is not branched.

13. A flat display device according to claim 10, wherein the wiring film is bent along a side portion of the flat display device.

14. A flat display device which mounts pixels on a substrate thereof in a matrix array, wherein
a plurality of terminals for connection with an external circuit is formed on an end portion of the substrate, a wiring film which is formed by mounting a plurality of first lines on an insulation film is connected to the plurality of terminals, and the wiring film includes a side portion which is connected with the plurality of terminals, the plurality of first lines to be connected with the plurality of terminals is formed on the wiring film, each first line of the plurality of first lines is, on a side portion at which the first lines are connected with the plurality of terminals, branched into a plurality of second lines that are parallel to the first line and have narrower widths than a width of the first line, and the plurality of first lines extend in parallel to a side portion of the wiring film, and in portions of the plurality of first lines close to the side portion of the wiring film, distances of branching positions of the first lines from the side portion are changed in order from the side portion of the wiring film.

15. A flat display device according to claim 14, wherein the plurality of first lines includes an outermost peripheral line in the wiring film.

* * * * *